United States Patent
Saber et al.

(10) Patent No.: US 10,505,566 B2
(45) Date of Patent: Dec. 10, 2019

(54) METHODS AND APPARATUS FOR ENCODING AND DECODING BASED ON LAYERED POLAR CODE

(71) Applicant: HUAWEI TECHNOLOGIES CO., LTD., Shenzhen, Guangdong (CN)

(72) Inventors: Hamid Saber, Ottawa (CA); Yiqun Ge, Kanata (CA); Wen Tong, Ottawa (CA); Ran Zhang, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/004,859

(22) Filed: Jun. 11, 2018

(65) Prior Publication Data

US 2018/0367163 A1    Dec. 20, 2018

Related U.S. Application Data

(60) Provisional application No. 62/520,329, filed on Jun. 15, 2017.

(51) Int. Cl.
| | | |
|---|---|---|
| *H03M 13/11* | (2006.01) | |
| *H03M 13/00* | (2006.01) | |
| *H03M 13/13* | (2006.01) | |
| *H03M 13/53* | (2006.01) | |

(52) U.S. Cl.
CPC ....... *H03M 13/1148* (2013.01); *H03M 13/13* (2013.01); *H03M 13/616* (2013.01); *H03M 13/6362* (2013.01); *H03M 13/6516* (2013.01)

(58) Field of Classification Search
CPC ............. H03M 13/1148; H03M 13/13; H03M 13/616; H03M 13/6362; H03M 13/6516
See application file for complete search history.

(56) References Cited

U.S. PATENT DOCUMENTS

| | | | | |
|---|---|---|---|---|
| 2013/0283128 A1* | 10/2013 | Lee | ...................... | G06F 11/1068 714/773 |
| 2014/0019820 A1* | 1/2014 | Vardy | .................... | H03M 13/13 714/752 |
| 2014/0040214 A1* | 2/2014 | Ma | .......................... | H03M 7/30 707/693 |
| 2015/0092886 A1* | 4/2015 | Ionita | .................. | H04L 25/4917 375/298 |

(Continued)

FOREIGN PATENT DOCUMENTS

WO    2017061891 A1    4/2017

OTHER PUBLICATIONS

R1-164039 Huawei et al.,"Polar codes—encoding and decoding" 3GPP TSG RAN WG1 Meeting #85, Nanjing, China, May 23-27, 2016, total 7 pages.

(Continued)

*Primary Examiner* — April Y Blair
*Assistant Examiner* — Dipakkumar B Gandhi

(57) ABSTRACT

In a layered coding approach, a code configuration parameter of a polar code is determined, and encoding graph parameters are determined based on the determined code configuration parameter. The encoding graph parameters identify inputs for one or more kernel operations in each of multiple encoding layers. Information symbols are encoded by applying the one or more kernel operations to the inputs identified in each encoding layer in accordance with the determined encoding graph parameters.

20 Claims, 12 Drawing Sheets

$$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

(56) References Cited

U.S. PATENT DOCUMENTS

2015/0295593 A1* 10/2015 Trifonov .......... H03M 13/3746
714/776

OTHER PUBLICATIONS

Noam Presman et al.,"Polar Codes with Mixed Kernels", 2011 IEEE International Symposium on Information Theory Proceedings, Jul. 31-Aug. 5, 2011, total 5 pages.

Noam Presman et al.,"Mixed-Kernels Constructions of Polar Codes", IEEE Journal on Selected Areas in Communications (vol. 34 , Issue: 2 , Feb. 2016 ), total 15 pages.

E. Arikan, "Channel Polarization: A Method for Constructing Capacity-Achieving Codes for Symmetric Binary-Input Memoryless Channels," IEEE Transactions on Information Theory, vol. 55, No. 7, 2009, pp. 3051-3073.

Tal and Vardy, "List Decoding of Polar Codes", Proceedings of the 2011 IEEE International Symposium on Information Theory, Jul. 2011, 11 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \leftarrow 102$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \leftarrow 104$$

FIG. 1 a) (1,1) layer  b) (2,2) layer a) (0,1) layer  b) (1,2) layer

METHODS AND APPARATUS FOR ENCODING AND DECODING BASED ON LAYERED POLAR CODE

CROSS-REFERENCE TO RELATED APPLICATION

This application claims the benefit of U.S. Provisional Patent Application No. 62/520,329 entitled "METHODS AND APPARATUS FOR ENCODING AND DECODING BASED ON LAYERED POLAR CODE" filed Jun. 15, 2017, the entire content of which is incorporated herein by reference.

FIELD

The present disclosure relates to generally to communications and, in particular, to information encoding and decoding according to layered polar codes.

BACKGROUND

Polar codes are proposed as channel codes for use in future wireless communications, and have been selected for uplink and downlink enhanced Mobile Broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) decoding and its extension SC List (SCL) decoding, including Cyclic Redundancy Check (CRC)-aided list decoding, are effective and efficient options for decoding polar coded information.

Based on channel polarization, Arikan designed a channel code that is proven to achieve the capacity of symmetric channels. Polarization refers to a coding property that, as code length increases to infinity, bit-channels (also referred to as sub-channels) polarize and their capacities approach either zero (completely noisy channel) or one (completely perfect channel). In other words, bits encoded in high capacity sub-channels will experience a synthesized channel with equivalently high Signal-to-Noise Ratio (SNR), and will have a relatively high reliability or a high likelihood of being correctly decoded, and bits encoded in low capacity sub-channels will have low reliability or a low possibility to be correctly decoded. The fraction of perfect sub-channels is equal to the capacity of a channel.

SUMMARY

Illustrative embodiments are disclosed by way of example in the description and claims.

According to one embodiment, a method involves: obtaining a code configuration parameter of a polar code; obtaining, based on the code configuration parameter, encoding graph parameters that identify inputs for one or more kernel operations in each of multiple encoding layers; encoding information symbols by applying the one or more kernel operations to the inputs identified in each encoding layer in accordance with the encoding graph parameters.

Another embodiment relates to a non-transitory computer-readable medium storing instructions which when executed by one or more processors cause the one or more processors to perform such a method. In an embodiment, a non-transitory computer-readable medium stores instructions which, when executed by one or more processors, cause the one or more processors to perform a method that involves: obtaining a code configuration parameter of a polar code; obtaining, based on the code configuration parameter, encoding graph parameters that identify inputs for one or more kernel operations in each of multiple encoding layers; encoding information symbols by applying the one or more kernel operations to the inputs identified in each encoding layer in accordance with the encoding graph parameters.

Another embodiment relates to an apparatus that includes a processor and a non-transitory computer-readable medium, coupled to the processor, storing instructions which when executed by the processor cause the processor to perform such a method. In an embodiment, an apparatus includes a processor and a non-transitory computer-readable medium, coupled to the processor, storing instructions which, when executed by the processor, cause the processor to perform a method that involves: obtaining a code configuration parameter of a polar code; obtaining, based on the code configuration parameter, encoding graph parameters that identify inputs for one or more kernel operations in each of multiple encoding layers; encoding information symbols by applying the one or more kernel operations to the inputs identified in each encoding layer in accordance with the encoding graph parameters.

In another embodiment, an apparatus includes: an input to receive information symbols and an encoder coupled to the input. The encoder is configured to obtain a code configuration parameter of a polar code; to obtain, based on the code configuration parameter, encoding graph parameters that identify inputs for one or more kernel operations in each of multiple encoding layers; and to encode the information symbols to generate a codeword by applying the one or more kernel operations to the inputs identified in each encoding layer in accordance with the encoding graph parameters.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing one example of how a polar coding generator matrix can be produced from a kernel.

DETAILED DESCRIPTION

FIG. 1 is a diagram showing, by way of an illustrative example, how a polar coding generator matrix can be produced from a kernel $G_2$ 100. Note that FIG. 1 is an example. Other forms of kernel are also possible.

A polar code can be formed from a Kronecker product matrix based on a seed matrix or kernel $F=G_2$ 100. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figure 2:
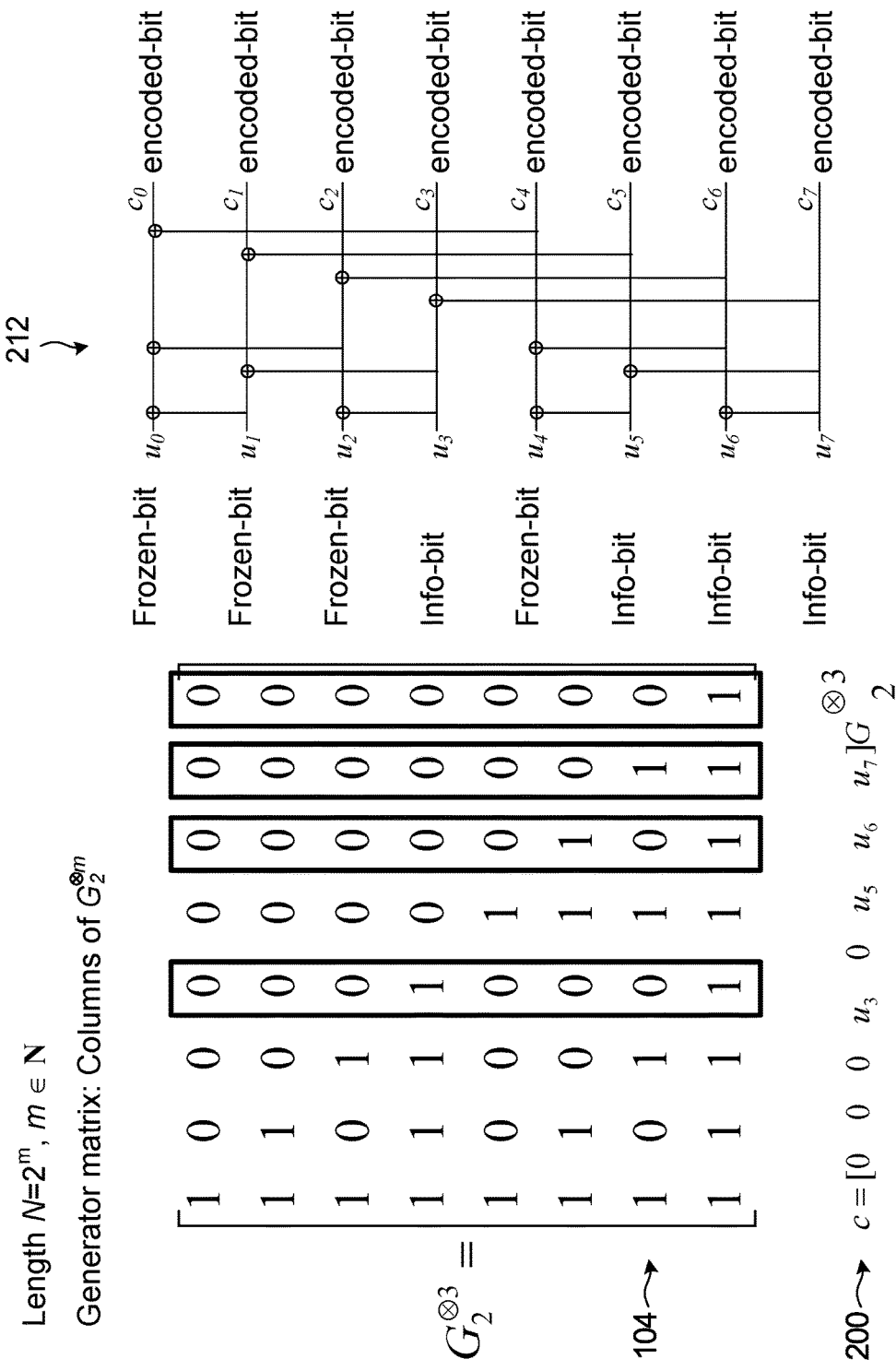
FIG. 2 is a diagram showing an example use of a polar coding generator matrix for producing codewords and a schematic illustration of an example polar encoder.

FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword c is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword c is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 2 is without bit reversal.

Generally, the output of a polar encoder can be expressed as $$C_0^{N-1}=u_0^{N-1}G_N,$$

where, without bit reversal, $G_N=F^{\otimes n}$ is an N-by-N generator matrix, $N=2^n$, $n\geq 1$ (e.g. for n=1, $G_2=F$ (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate of the physical channel. A reliability sequence (reliable and unreliable positions) could be calculated based on assumed or measured characteristics of the physical channel before the information is transmitted over the channel, for example. In theory, the frozen bits can be set to any value as long as the location and value of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from K information bits including one or more CRC bits, and (N−K) frozen bits. In this example, starting with a number of input bits, a CRC is calculated and appended to the input bits to produce a set of K information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted herein, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

Another type of polar decoding algorithm with better error correction performance, referred to as List or SCL decoding, is described in "List Decoding of Polar Codes" by Tal and Vardy, Proceedings of the 2011 *IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold LIST, the LIST paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted herein may be determined according to a metric.

Thus, there are two types of the decoding based on successive cancellation: SC decoding and List decoding. SC decoding is a special case of SCL decoding, with list size LIST=1. An SC decoder tracks only one decoding path. After the value of a decoded bit is estimated, the other possible value is ignored. Decoding continues with the next bit, assuming that each previous bit has been correctly estimated when updating partial sum results.

Figure 3:
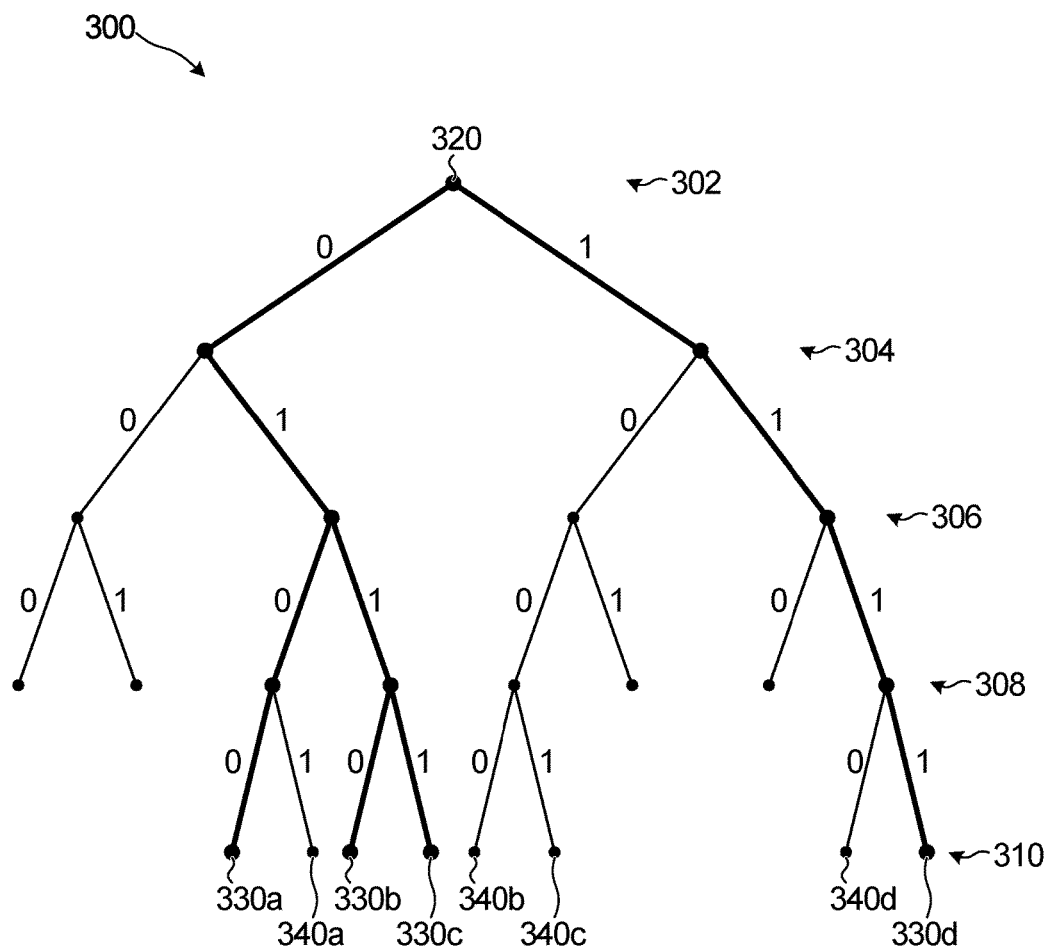
FIG. 3 is a diagram showing a portion of an example decision list tree whose width is limited by a maximum given list size and used in a Successive Cancellation List (SCL) polar decoder.

FIG. 3 is a diagram showing a portion of an example decision list tree 300 used in an SCL polar decoder, whose width is limited by a maximum given list size LIST. In FIG. 3 the list size LIST is 4. Five levels 302, 304, 306, 308, 310 of the decision tree are illustrated. Although five levels are illustrated, it should be understood that a decision tree to decode N bits would have N+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330a, for example, represents an estimated codeword bit sequence: 0, 1, 0, 0. At level 308, the number of possible paths is greater than LIST, so LIST paths having the highest likelihood (e.g. best Path Metrics) are identified, and the remaining paths are discarded. The decoding paths that survive after the path sort at level 306 are shown in bold in FIG. 3. Similarly, at level 310, the number of possible paths is again greater than LIST, so the LIST paths having the highest likelihood (e.g. best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

SCL decoding can be further divided into pure list decoding in which survivor paths with the highest likelihood are selected and CRC-Aided SCL (CA-SCL) decoding where CRC bits are used for path selection. A CRC may provide better error correction performance in the final path selection, but is optional in SCL decoding. Other decoding-assistant operations, such as a parity check based on parity or "PC" bits that are included in an input vector, could be used instead of or jointly with CRC in path selection during decoding or in the final path selection.

In an Additive White Gaussian Noise (AWGN) channel, a polar code in effect divides the channel into N sub-channels. N is referred to as the mother code length and is always a power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 4:
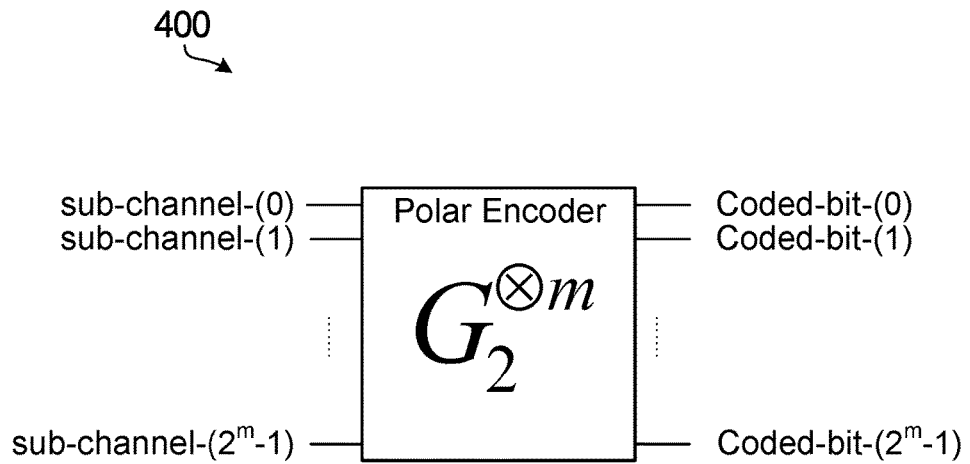
FIG. 4 is a block diagram illustrating an example of a polar encoder based on a 2-by-2 kernel.

Polar encoders based on Kronecker products of a 2-by-2 Arikan kernel $G_2$ are described herein. FIG. 4 is a block diagram illustrating an example of a polar encoder 400 based on a 2-by-2 kernel. Sub-channels and coded bits are labeled in FIG. 4. A channel is divided into N sub-channels by a polar code as noted herein, and $m=\log_2(N)$ for an Arikan polar code. An information block and frozen bits are allocated onto the N sub-channels, and the resultant N-sized vector is multiplied with an N-by-N Kronecker matrix by the polar encoder 400 to generate a codeword that includes N coded bits. An information block includes at least information bits and could also include assistant bits such as CRC bits or PC bits. A sub-channel selector (not shown) could be coupled to the polar encoder 400 to select sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels could be generally characterized by code length $N=L^n$, where L is the dimension (i.e., the number of inputs or kernel size) of the applied kernel. For example, other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over the synthesized sub-channels. Some synthesized sub-channels have high capacity, and some sub-channels have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

One factor that can play an important role in the performance of polar codes is the notion of code exponent. In general for a sequence of codes (not necessarily polar codes) with different code lengths N, a code exponent of β means that the block error rate (BLER) behaves as $O(2^{N \cdot \beta})$. In other words, when the code length N becomes sufficiently large the BLER changes almost as $O(2^{N \cdot \beta})$. As can be seen, a larger code exponent β will cause the BLER to decay sooner with increasing code length. Equivalently β shows how fast BLER goes to zero with increasing code length.

With polar codes, different kernels give different code exponents. To give some examples, codes constructed with Arikan's kernel $$F = \begin{bmatrix} 1 & 0 \\ 1 & 1 \end{bmatrix}$$

have an exponent of β=0.5. Codes constructed with kernel $$F = \begin{bmatrix} 1 & 0 & 0 \\ 1 & 0 & 1 \\ 1 & 1 & 1 \end{bmatrix}$$

have an exponent of β=0.33. It can be shown that there is a 16×16 binary kernel constructed from a BCH matrix with an exponent of β=0.5182. Although it is possible to improve the code exponent by constructing better kernels, it is also possible to improve the exponent for a fixed kernel by allowing an improved code construction. For example, one can employ Arikan's kernel and construct the code in a different way from Arikan's method to obtain larger code exponents. According to embodiments of the present disclosure, a new polar coding technique that is expected to give larger exponent and superior finite code length behavior is proposed. In fact it may be possible to improve the code exponent of Arikan kernel to 0.79 using this new construction method. The proposed codes and coding techniques may result in smaller block error rates (BLERs) than Arikan's code for different rates and information block lengths. The proposed polar codes could be considered twisted or layered polar codes, and are referenced herein primarily as layered polar codes.

An $(N=L^n, K)$ layered polar code defined over a finite field GF(q) is described by an N×N generator matrix $G_N$, an information set A of size K and a frozen set F={(0, 1, 2, . . . , N-1}-A, and an L×L kernel $F_{L \times L} = [f_{i,j}]$ where $f_{i,j} \in GF(q)$. To encode K information symbols $a_0, a_1, \ldots, a_{K-1}$, which may include one or more bits, those symbols are placed into a vector $u = [u_0, u_1, \ldots, u_{N-1}]$ at positions or places corresponding to indices specified in A and all the other $u_i$ are set 0 or another value that is used for frozen positions known to both encoder and decoder. The resulting vector is then multiplied by $G_N$ to generate a codeword, $c = uG_N$.

By way of example, encoding of layered polar codes is described in terms of encoding circuits or graphs. A layered polar code is constructed by m layers of polarizations. An encoding circuit or graph is described by m pairs of $(s_i, d_i)$, i=1, . . . , m, where $s_i$ is referred to herein as a starting point or index and $d_i$ is referred to herein as a separating distance or separation distance, of each layer i.

In an embodiment, an encoding circuit receives N input symbols and applies m layers of encoding using an L-by-L kernel F to produce an output codeword. A first layer receives $u = u_0, u_1, \ldots, U_{N-1}$ as its input, and each subsequent layer receives the output of the previous layer as its input. Consider a layer with parameters (s, d). This is referred to herein as an (s, d) layer. The layer applies F, or equivalently applies one or more kernel operations associated with the kernel F, on sets of L input symbols from its input vector, which are located within a distance of d from each other, starting from the s-th element.

In the present disclosure, reference is made to applying kernels or kernel operations, and these are intended to be equivalent. Kernel processing could be considered to involve applying one or more kernels at each encoding layer, applying one or more kernel operations associated with a kernel at each encoding layer, or otherwise applying processing that is consistent with a kernel to encoding layer inputs.

The result of kernel processing at an encoding layer is passed as input to the next layer which then uses the same procedure to generate its output. In more detail, denote the input and output of such a layer by $[x_0, x_1, \ldots, x_{N-1}]$ and $[y_0, y_1, \ldots, y_{N-1}]$, respectively. The layer encoding is defined as $$[y_{s+kLd}, y_{s+(kL+1)d}, y_{s+(kL+2)d}, \ldots, y_{s+(kL+L-1)d}]_{1 \times L} = [x_{s+kLd},$$
$$x_{s+(kL+1)d}, x_{s+(kL+2)d}, \ldots, x_{s+(kL+L-1)d}]F - \frac{s}{Ld} \leq k < \frac{N-s}{dL} + \frac{1-L}{L}$$

For $y_j$ where ((j−s) mod d)≠0, $y_j = x_j$. In other words, a layer only applies F on the inputs . . . , $x_{s-2d}, x_{s-d}, x_s, x_{s+d}, x_{s+2d}, x_{s+3d}, \ldots$ (separated by d) to generate . . . , $y_{s-2d}, y_{s-d}, y_s, y_{s+d}, y_{s+2d}, y_{s+3d}, \ldots$ All other $x_1$ are copied or otherwise passed to the output, i.e. $y_j = x_1$.

Figure 5:
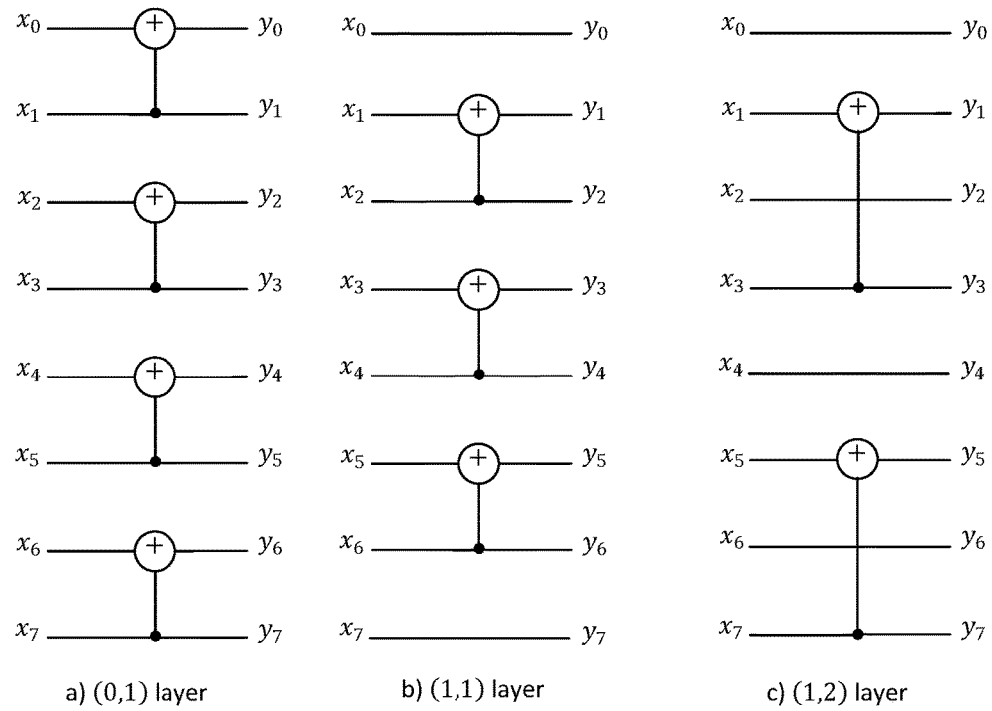
FIG. 5 is a block diagram illustrating three example encoding layers for an Arikan kernel.

FIG. 5 is a block diagram illustrating three example encoding layers, in this example for an Arikan kernel $$F = \begin{bmatrix} 1 & 0 \\ 1 & 1 \end{bmatrix},$$

and N=8. The examples in FIG. 5 include a (0,1) layer at a), a (1,1) layer at b), and a (1,2) layer at c). These are independent layer examples, and are not layers that are coupled together in a single encoder. The same applies to the following FIG. 6 and FIG. 7. As in FIG. 2, the circled "+" symbols in FIG. 5 represent modulo 2 addition. In the case of an Arikan kernel, each kernel or kernel operation that is applied at each layer has two inputs and two outputs. In the example a) in FIG. 5, there are four kernels or kernel operations, with (inputs|outputs) $(x_0, x_1|y_0, y_1)$, $(x_2, x_3|y_2, y_3)$, $(x_4, x_5|y_4, y_5)$, $(x_6, x_7|y_6, y_7)$. The example at b) in FIG. 5 includes three kernels or kernel operations, with (inputs|outputs) $(x_1, x_2|y_1, y_2)$, $(x_3, x_4|y_3, y_4)$, $(x_5, x_6|y_5, y_6)$. The example at c) in FIG. 5 includes two kernels or kernel operations, with (inputs|outputs) $(x_1, x_3|y_1, y_3)$, $(x_5, x_7|y_5, y_7)$.

The kernel F defines the encoding that is performed. In this example of a 2-by-2 Arikan kernel, inputs are combined in pairs. The s and d layer values define or identify the layer inputs to which the kernel F is to be applied. The (0,1) notation at a) indicates that F is applied to an input starting at position 0 ($x_0$ in this example) and an input that is separated from position 0 by 1, which is $x_1$. The kernel F is also applied to other inputs at positions that are separated, by d, from a previous position to which a kernel is applied. At a) in FIG. 5, the next position would be position 2 (input $x_2$), because the previous position to which the kernel F was applied is position 1, and then the next position separated from position 2 by d=1 is position 3 (input $x_3$), and so on as shown in FIG. 5.

Thus, d represents the distance between inputs to kernels or kernel operations in a layer. The distance d between inputs not only represents the distance between inputs to the same kernel or kernel operation in a layer, but also represents the distance between the last input and the first input of two adjacent kernels or kernel operations in the same layer. More generally, layered encoding uses one or more ("seed" or "basic") kernels or kernel operations in each layer.

In the example b) in FIG. 5, s=1 and therefore the starting position is 1. Position 0 (input $x_0$) is skipped for kernel processing, and is copied or otherwise propagated to output as $y_0$. The kernel F is applied to the inputs at starting position s=1 and the next position that is separated from position 1 by d=1 (i.e., $x_1$ and $x_2$ in this example), and similarly to the inputs at positions 3 and 4 and at positions 5 and 6. In the example shown, $x_7$ is also skipped for kernel processing because position 7 is the last position and there are no further positions separated from position 7 by d=1. In another embodiment, a modulus condition could be applied in selecting positions for kernel processing, in which case $x_7$ and $x_0$ could be identified as bit positions that satisfy the separation condition or parameter d=1 and have not already been used as inputs for kernel processing.

As can be seen, the s and d, generally identify the kernel or kernel operation inputs in each particular layer of the encoding circuit or graph. However, the present disclosure is not limited to s and d and different graph parameters may be used to identify the kernel inputs. As will be explained in greater detail below, the encoding graph parameters are determined based on one or more code construction parameters such as K, N which are information block length and code block length, respectively, and code rate R=K/N. In some embodiments, the use of graph parameters may be helpful to construct more efficient codes for particular values of K, N and/or R or to switch between different code configurations for different values of K, N and/or R.

In some embodiments, s need not necessarily identify a starting position from $x_0$ as a reference point as in the above examples. In other embodiments, s could identify the starting position relative to a different reference point and d could therefore also initially run from a different reference point, such as a last input position $x_8$ or a mid position $x_4$. In such embodiments, identifying the input positions from s and/or d could involve proceeding through the inputs in a modulo fashion, from $x_8$ to $x_0$ and onward for example, or from $x_8$, $x_7$, and all of the way up to $x_0$, with or without any modulo operation.

In the example at c) in FIG. 5, s=1 and d=2, and therefore $x_0$ is again skipped as in the example at b) and $x_1$ is the first input that is selected for kernel processing. With d=2, the next selected position is position 3, and the kernel F is applied to $x_1$ and $x_3$. After the input $x_3$ at position 3, the next input positions for kernel processing according to the separation condition or parameter d=2 are positions 5 and 7. Other inputs are copied or otherwise propagated to corresponding output positions.

Figure 6:
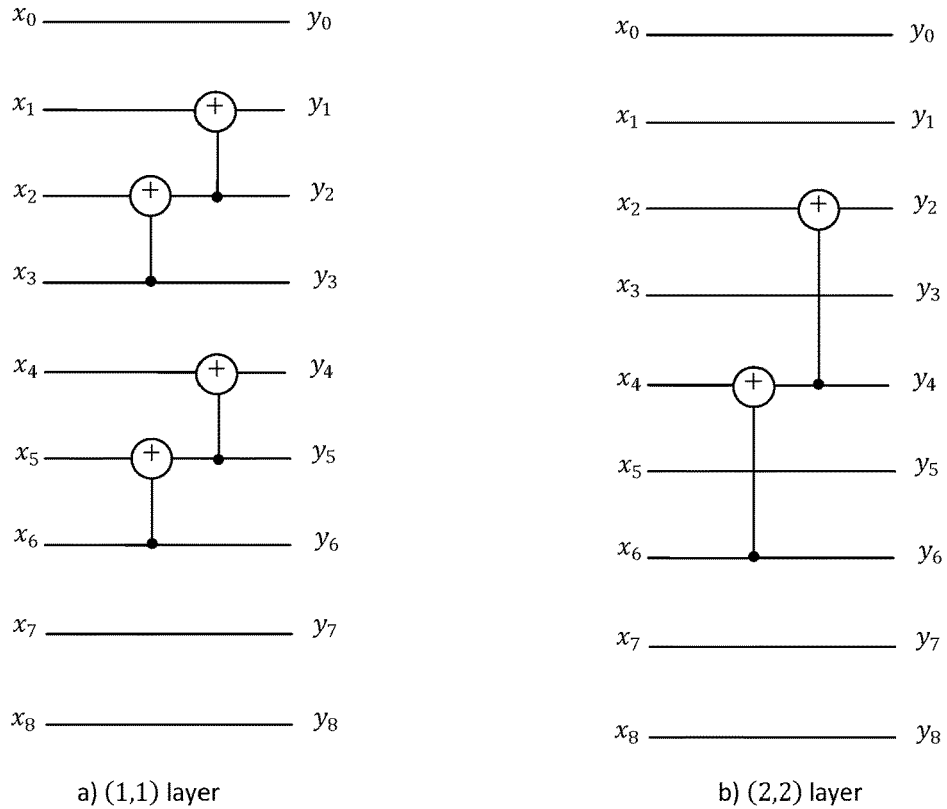
FIG. 6 is a block diagram illustrating two example encoding layers for a 3-by-3 kernel.

Although the present disclosure is concerned primarily with Arikan kernels and code lengths $N=2^n$, further example encoding layers are shown in FIG. 6, for a 3-by-3 kernel $$F = \begin{bmatrix} 1 & 0 & 0 \\ 1 & 1 & 0 \\ 1 & 1 & 1 \end{bmatrix}$$

and code length $N=3^2$. The examples shown in FIG. 6 include a (1,1) layer at a) and a (2,2) layer at b). As in the examples described herein with reference to FIG. 5, the s and d parameters in each example define or identify the input positions or inputs to which kernels or kernel operations are to be applied, and the kernel defines the encoding that is to be performed, on triplets of input positions in the case of a 3-by-3 kernel in the example of FIG. 6.

The circled "+" symbols in FIG. 6 represent modulo 2 addition. In the example a) in FIG. 6, there are two kernels or kernel operations, with (inputs|outputs) $(x_1, x_2, x_3|y_1, y_2, y_3)$, $(x_4, x_5, x_6|y_4, y_5, y_6)$. The example at b) in FIG. 6 includes one kernel or kernel operation, with (inputs|outputs) $(x_3, x_4, x_6|y_2, y_4, y_6)$.

Figure 7:
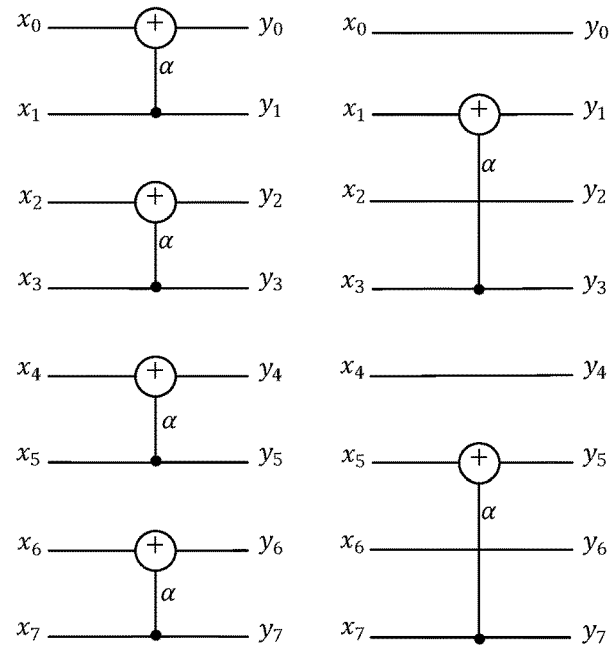
FIG. 7 is a block diagram illustrating two example encoding layers for a non-binary kernel.

FIG. 7 is a block diagram illustrating two example encoding layers for a non-binary kernel $$F = \begin{bmatrix} 1 & 0 \\ \alpha & 1 \end{bmatrix}$$

and $N=2^3$ where a is the primitive element of Galois field GF(q) for some q, and N is the number of non-binary symbols of the codeword. Input definition or selection in FIG. 7 is consistent with the description herein for the (0,1) and (1,2) encoding layers in FIG. 5. The circled "+" symbols in FIG. 7 represent symbol-wise addition. For example, for 4-ary symbols having values of 0,1,2,3, the output of addition may be any value of 0,1,2,3. The examples at a) and b) in FIG. 7 include four kernels or kernel operations and two kernels or kernel operations, respectively, as shown at a) and c) in FIG. 5 and described above. In FIG. 7, however, the kernels or kernel operations, and the kernel or kernel operation inputs and outputs, are non-binary.

The encoding circuit of a length-N layered polar code with m layers and parameters $(s_1, s_2, \ldots, s_m)$ and $(d_1, d_2, \ldots, d_m)$ is obtained in an embodiment by applying the input vector $u=[u_0, u_1, \ldots, U_{N-1}]$ to the first $(s_1, d_1)$-layer. The output of this layer is then applied to the $(s_2, d_2)$-layer. This process continues until the output of the $(s_m, d_m)$ layer is obtained, which is a codeword of the layered polar code $c=uG_N$.

SC decoding may be used to decode layered polar codes. However, depending on the layer parameters $(s_i, d_i)$, $i=1, \ldots, m$, it might be more useful to decode $\rho$ adjacent information symbols jointly rather than decoding one information symbol at a time as an SC decoder of conventional polar code does. This introduces the notion of $\rho$-symbol sub-channel. For illustrative purposes, assuming that transmission is carried out over a binary symmetric channel $W(y|u)$, and the layered polar code is defined over a Galois field GF(q), a $\rho$-symbol sub-channel $W_N^{(i,\rho)}$ is defined as $$W_N^{(i,\rho)}(y_1^N, u_1^{i-1} \mid u_i^{i+\rho-1}) = \frac{1}{q^{N-\rho}} W^N(y_1^N \mid u_1^N).$$

In the above equation, $W^N$ is the vector channel created by transmitting the codeword $c_1^N$ corresponding to $u_1^N$ over $W$ and $y_1^N$ is the received vector. SC decoding decodes $\hat{u}_i^{+\rho-1}$ based on the observed/received vector $y_1^N$ and previous decoded bits $\hat{u}_1^{i-1}$. A layered polar code with information length K, should use the K most reliable bit-channels to transmit the information symbols and the rest of the sub-channels are frozen.

Layered polar codes can be constructed by choosing the number of encoding layers m and the layer parameter $(s_i, d_i)$, $1 \le i \le m$ based on one or more, or different combinations of, code configuration parameters. Several examples are described below, with reference to code configuration parameters K and N, which are information block length and code block length, respectively, and code rate $$R = \frac{K}{N}.$$

Consider a first type of layered polar code, referred to herein as a "Type A" layered polar code, in which m is a function of N and $(s_i, d_i)$ are functions of layer number or index i:

$$m = m(N)$$

$$s_i = s_i(i), \ 1 \le i \le m$$

$$d_i = d_i(i), \ 1 \le i \le m.$$

As an example 1) of a Type A layered polar code for $$F = \begin{bmatrix} 1 & 0 \\ 1 & 1 \end{bmatrix}$$

and mother code length $N=2^n$:

$$m = N-1$$

For $\forall i, \ 2^k \le i < 2^{k+1}$ $$d_i = 2^k$$

$$s_i = 2d_i - i - 1.$$

Figure 8A:
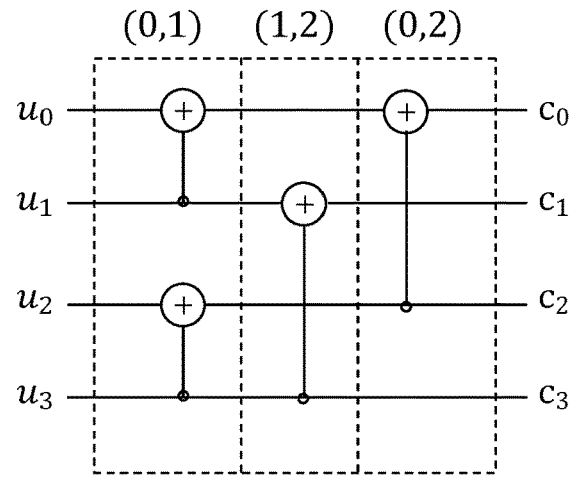
FIG. 8A is a block diagram illustrating an encoder for a three-layer polar code.

FIG. 8A is a block diagram illustrating an encoder for the three-layer polar code of length N=4 according to the code construction presented in example 1).

According to a second type of layered polar code, referred to herein as a "Type B" layered polar code, m is a function of N and $(s_i, d_i)$ are functions of N and layer number or index i:

$$m = m(N)$$

$$s_i = s_i(i,N), \ 1 \le i \le m$$

$$d_i = d_i(i,N), \ 1 \le i \le m.$$

As an example 2) of a Type B layered polar code for $$F = \begin{bmatrix} 1 & 0 \\ 1 & 1 \end{bmatrix}$$

and mother code length $N=2^n$:

$$m = 3N/2 - 2$$

$$\text{For } \forall i, \ d_i = \begin{cases} 2^{k-1} & \text{if } 2^k - 1 \le i < 2^{k+1} - 1 \text{ and } i \le N-2 \\ \dfrac{N}{2} & \text{if } N-2 < i \le \dfrac{3N}{2} - 2 \end{cases},$$

$$s_i = \begin{cases} 2^{k+1} - i - 2 & \text{if } 2^k - 1 \le i < 2^{k+1} - 1 \text{ and } i \le N-2 \\ \dfrac{3N}{2} - i - 2 & \text{if } N-2 < i \le \dfrac{3N}{2} - 2, \end{cases}$$

Figure 8B:
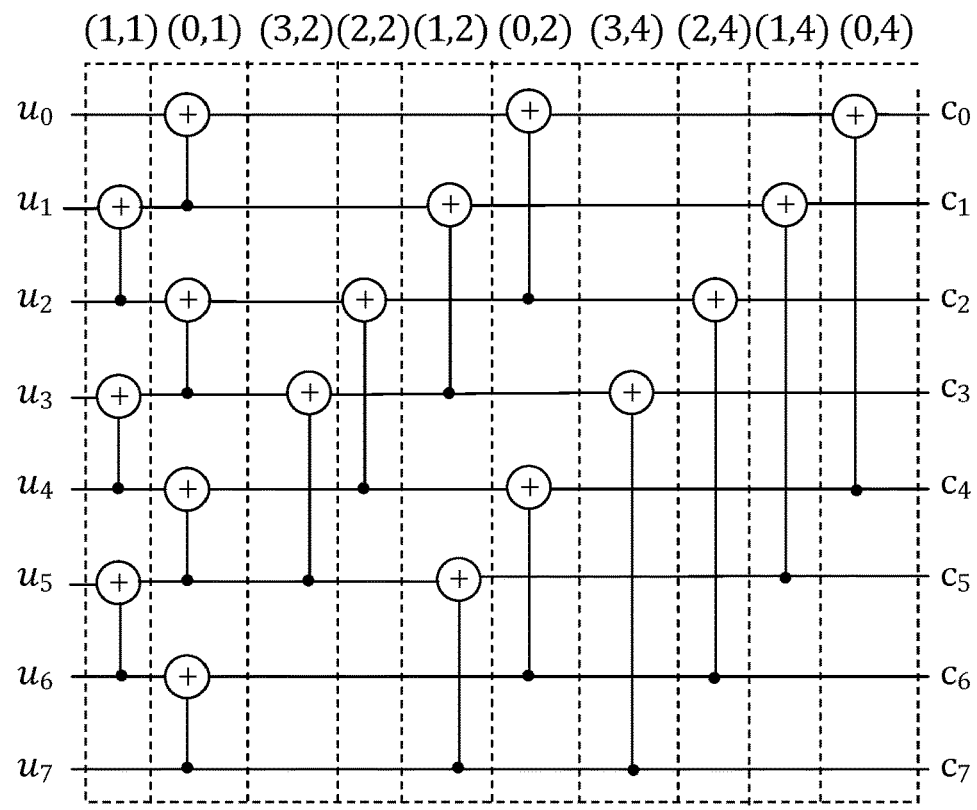
FIG. 8B is a block diagram illustrating an encoder for a three-layer polar code of length N=8.

FIG. 8B is a block diagram illustrating an encoder for the three-layer polar code of length N=8 according to the code construction presented in example 2).

In a third type of layered polar code, referred to herein as a "Type C" layered polar code, m is a function of K and N and $(s_i, d_i)$ are functions of K and layer number or index i:

$$m = m(K,N)$$

$$s_i = s_i(i,K), \ 1 \le i \le m$$

$$d_i = d_i(i,K), \ 1 \le i \le m.$$

As an example 3) of a Type C layered polar code for $$F = \begin{bmatrix} 1 & 0 \\ 1 & 1 \end{bmatrix}$$

and mother code length $N=2^n$, the encoding graph or circuit parameters m, s, d are determined based in part on an integer $\alpha \le \lfloor \log_2 K \rfloor$:

$$m = 2^{\lfloor \log_2 K \rfloor - \alpha}(N-1)$$

For $\forall i, \ 2^{k+\lfloor \log_2 K \rfloor - \alpha} - 2^{\lfloor \log_2 K \rfloor - \alpha} + 1 \le i \le 2^{k+1+\lfloor \log_2 K \rfloor - \alpha} - 2^{\lfloor \log_2 K \rfloor - \alpha}$ $$d_i = 2^k$$

$$s_i = 2^{k+1} i - 1.$$

In a fourth type of layered polar code, referred to herein as a "Type D" layered polar code, m is a function of K and N and $(s_i, d_i)$ are functions of K, N and layer number or index i:

$m = m(K, N)$ $s_i = s(i, K, N), 1 \le i \le m$ $d_i = d_i(i, K, N), 1 \le i \le m.$

As an example 4) of a Type D layered polar code for $$F = \begin{bmatrix} 1 & 0 \\ 1 & 1 \end{bmatrix}$$

and mother code length $N=2^n$, the encoding graph parameters are based in part on an integer $\alpha \le \lfloor \log_2 K \rfloor$, with $\alpha$ being an integer in this example, not to be confused with a Galois field primitive element in a previous example:

$$m = 2^{\lfloor \log_2 K \rfloor - \alpha}(3N/2 - 2)$$

For $\forall i$, $$d_i = \begin{cases} 2^{k-1} & \text{if } \begin{array}{l} 2^{k+\lfloor \log_2 K \rfloor - \alpha} - 2^{\lfloor \log_2 K \rfloor - \alpha + 1} < i \le 2^{k+\lfloor \log_2 K \rfloor - \alpha + 1} - \\ 2^{\lfloor \log_2 K \rfloor - \alpha + 1} \text{ and } i \le 2^{\lfloor \log_2 K \rfloor - \alpha}(N-2) \end{array} \\ \dfrac{N}{2} & \text{if } 2^{\lfloor \log_2 K \rfloor - \alpha}(N-2) < i \le 2^{\lfloor \log_2 K \rfloor - \alpha}(3N/2 - 2) \end{cases},$$

$$s_i = \begin{cases} 2^{k+1} - i - 2 & \text{if } \begin{array}{l} 2^{k+\lfloor \log_2 K \rfloor - \alpha} - 2^{\lfloor \log_2 K \rfloor - \alpha + 1} < i \le 2^{k+\lfloor \log_2 K \rfloor - \alpha + 1} - \\ 2^{\lfloor \log_2 K \rfloor - \alpha + 1} \text{ and } i \le 2^{\lfloor \log_2 K \rfloor - \alpha}(N-2) \end{array} \\ \dfrac{3N}{2} - i - 2 & \text{if } 2^{\lfloor \log_2 K \rfloor - \alpha}(N-2) < i \le 2^{\lfloor \log_2 K \rfloor - \alpha}(3N/2 - 2), \end{cases}$$

The above examples 1) to 4) all use binary Arikan kernels. Non-binary Arikan kernels are also contemplated.

Figure 9:
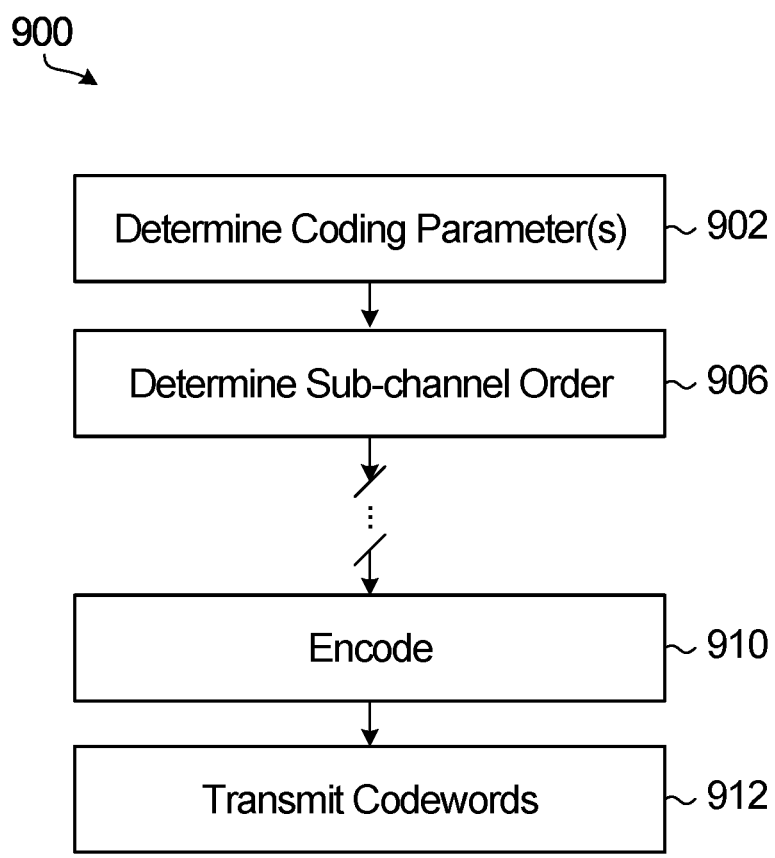
FIG. 9 is a flow diagram of an example coding method according to an embodiment.

FIG. 9 is a flow diagram of an example coding method according to an embodiment. The illustrated example method 900 includes determining coding parameters at 902. The coding parameter(s) could include at least a mother code block length N, which could be read from memory or otherwise provided. N could instead be computed based on a given K and a given code rate R, for example. Encoding graph parameters m,s,d are also determined at 902 as disclosed herein. The encoding graph parameters could be determined dynamically or read from memory for a given combination of coding parameters.

At 906, an order of coding sub-channels is determined. A rule set could be used to reduce the number of reliability computations and polynomial comparisons that are involved in determining sub-channel order at 906, for example, which could make it feasible to determine sub-channel order online when information is to be encoded or decoded.

An ordered sub-channel sequence as determined at 906 could be used to select information sub-channels, frozen sub-channels, and/or other types of sub-channels when information is to be encoded at 910. Codewords are then transmitted at 912.

The example method in FIG. 9 is intended for illustrative purposes. Other embodiments could involve performing the illustrated operations in any of various ways, performing fewer or additional operations, and/or varying the order in which operations are performed.

Figure 10:
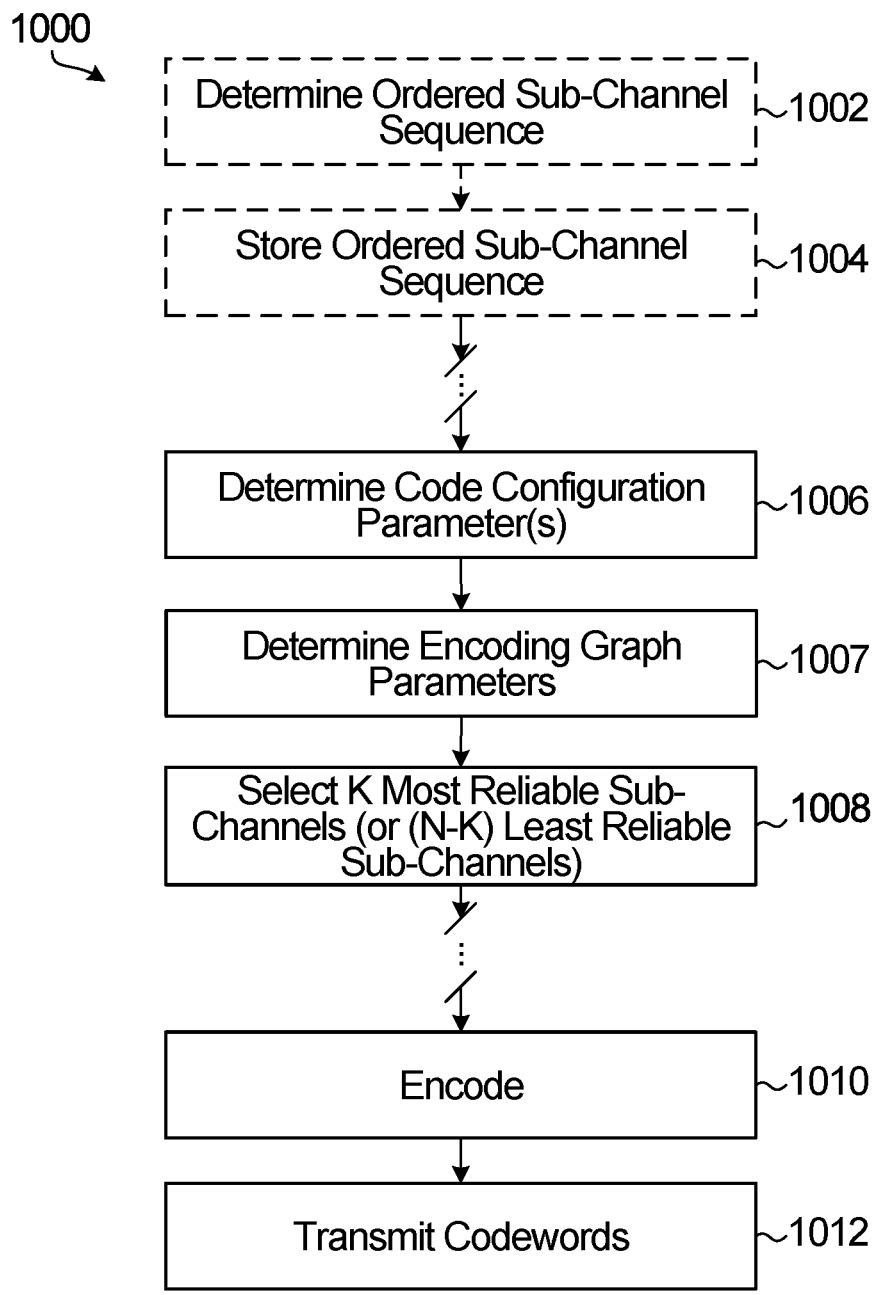
FIG. 10 is a flow diagram of an example coding method according to a further embodiment.

FIG. 10 is a flow diagram of an example of such a coding method 1000 according to a further embodiment. The example method 1000 involves determining an ordered sequence of sub-channels at 1002 and storing the determined ordered sub-channel sequence at 1004. In some implementations, these steps may be optional and/or performed in advance, separately from other coding operations in coding method 1000. For example, the coding method 1000 may instead simply include determining an ordered sub-channel sequence at 1002 by retrieving or reading the stored the ordered sub-channel sequence from memory. Other possibilities exist.

One or more code configuration parameters of a polar code are determined at 1006, and could be read from memory or otherwise provided. Based on the determined code configuration parameter(s), encoding graph parameters are determined at 1007. The encoding graph parameters could be determined dynamically or read from memory for a given combination of code configuration parameters.

The encoding graph parameters identify inputs for one or more kernel operations in each of multiple encoding layers. At 1008, K most reliable sub-channels, or (N–K) least reliable sub-channels, of the N sub-channels are selected. The encoding at 1010 involves encoding information symbols onto the K most reliable sub-channels, according to the selection at 1008. The information symbols are encoded by applying the one or more kernel operations to the inputs identified in each encoding layer in accordance with the encoding graph parameters that are determined at 1007. Codewords that are generated by the encoding at 1010 are transmitted at 1012.

The example method 1000 is intended for illustrative purposes. Other embodiments could involve performing the illustrated operations in any of various ways, performing fewer or additional operations, and/or varying the order in which operations are performed. Other variations could be or become apparent to a skilled person based on the present disclosure. For example, any one or more of the following could be provided, alone or in any of various combinations, in embodiments:

determining a code configuration parameter involves determining one or more of mother code length N and information block length K;

the encoding graph parameters include a number of encoding layers m and, for each of the encoding layers, a starting point $s_i$ identifying a position of a first input of an encoding layer i, $1 \le i \le m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied;

m is a function of N and $(s_i, d_i)$ are functions of i;

determining the encoding graph parameters involves determining the encoding graph parameters in accordance with:

$m = N - 1$

For $\forall i$, $2^k \le i < 2^{k+1}$ $d_i = 2^k$ $s_i = 2d_i - i - 1$;

m is a function of N and $(s_i, d_i)$ are functions of N and i;

determining the encoding graph parameters involves determining the encoding graph parameters in accordance with:

$$m = 3N/2 - 2$$

$$\text{For } \forall i, d_i = \begin{cases} 2^{k-1} & \text{if } 2^k - 1 \leq i < 2^{k+1} - 1 \text{ and } i \leq N - 2 \\ \frac{N}{2} & \text{if } N - 2 < i \leq \frac{3N}{2} - 2 \end{cases},$$

$$s_i = \begin{cases} 2^{k+1} - i - 2 & \text{if } 2^k - 1 \leq i < 2^{k+1} - 1 \text{ and } i \leq N - 2 \\ \frac{3N}{2} - i - 2 & \text{if } N - 2 < i \leq \frac{3N}{2} - 2, \end{cases};$$

m is a function of K and N and $(s_i, d_i)$ are functions of K and i;

determining the encoding graph parameters involves determining the encoding graph parameters based in part on an integer $\alpha \leq \lfloor \log_2 K \rfloor$ and in accordance with:

$$m = 2^{\lfloor \log_2 K \rfloor - \alpha}(N-1)$$

For $\forall i, 2^{k + \lfloor \log_2 K \rfloor - \alpha} - 2^{\lfloor \log_2 K \rfloor - \alpha + 1} \leq i \leq 2^{k+1+\lfloor \log_2 K \rfloor - \alpha} - 2^{\lfloor \log_2 K \rfloor - \alpha}$ $$d_i = 2^k$$

$$s_i = 2^{k+1} i - 1.$$

m is a function of K and N and $(s_i, d_i)$ are functions of K, N and i;

determining the encoding graph parameters involves determining the encoding graph parameters based in part on an integer $\alpha \leq \lfloor \log_2 K \rfloor$ and in accordance with:

$$m = 2^{\lfloor \log_2 K \rfloor - \alpha}(3N/2 - 2)$$

For $\forall i,$ $$d_i = \begin{cases} 2^{k-1} & \text{if } \begin{array}{l} 2^{k+\lfloor \log_2 K \rfloor - \alpha} - 2^{\lfloor \log_2 K \rfloor - \alpha + 1} < i \leq 2^{k+\lfloor \log_2 K \rfloor - \alpha + 1} - \\ 2^{\lfloor \log_2 K \rfloor - \alpha + 1} \text{ and } i \leq 2^{\lfloor \log_2 K \rfloor - \alpha}(N-2) \end{array} \\ \frac{N}{2} & \text{if } 2^{\lfloor \log_2 K \rfloor - \alpha}(N-2) < i \leq 2^{\lfloor \log_2 K \rfloor - \alpha}(3N/2 - 2) \end{cases},$$

$$s_i = \begin{cases} 2^{k+1} - i - 2 & \text{if } \begin{array}{l} 2^{k+\lfloor \log_2 K \rfloor - \alpha} - 2^{\lfloor \log_2 K \rfloor - \alpha + 1} < i \leq 2^{k+\lfloor \log_2 K \rfloor - \alpha + 1} - \\ 2^{\lfloor \log_2 K \rfloor - \alpha + 1} \text{ and } i \leq 2^{\lfloor \log_2 K \rfloor - \alpha}(N-2) \end{array} \\ \frac{3N}{2} - i - 2 & \text{if } 2^{\lfloor \log_2 K \rfloor - \alpha}(N-2) < i \leq 2^{\lfloor \log_2 K \rfloor - \alpha}(3N/2 - 2), \end{cases};$$

the one or more kernel operations are associated with a binary or non-binary Arikan kernel;

the one or more kernel operations include more than one kernel operation in at least one of the multiple encoding layers;

the one or more kernel operations include more than one kernel operation in each of the multiple encoding layers.

Although FIGS. 9, 10 show example operations that would be performed at an encoder (or transmitter), other embodiments could be implemented at a decoder (or receiver). A word that is based on a codeword of a code could be received at a receiver and decoded, based on sub-channels that are selected by the decoder or a sub-channel selector coupled to the decoder and coding parameters including code configuration parameters and encoding graph parameters that are determined according to a method as shown in any of FIGS. 9, 10 and/or as otherwise disclosed herein.

In another embodiment, a non-transitory processor-readable medium stores instructions which, when executed by one or more processors, cause the one or more processors to perform a method as disclosed herein. In an embodiment, a non-transitory computer-readable medium stores instructions which, when executed by one or more processors, cause the one or more processors to perform a method that involves: determining a code configuration parameter of a polar code; determining, based on the determined code configuration parameter, encoding graph parameters that identify inputs for one or more kernel operations in each of multiple encoding layers; encoding information symbols by applying the one or more kernel operations to the inputs identified in each encoding layer in accordance with the determined encoding graph parameters. Any one or more of the features listed above or otherwise disclosed herein could be provided, alone or in any of various combinations, in embodiments that involve a processor and a non-transitory computer-readable medium.

Figure 11:
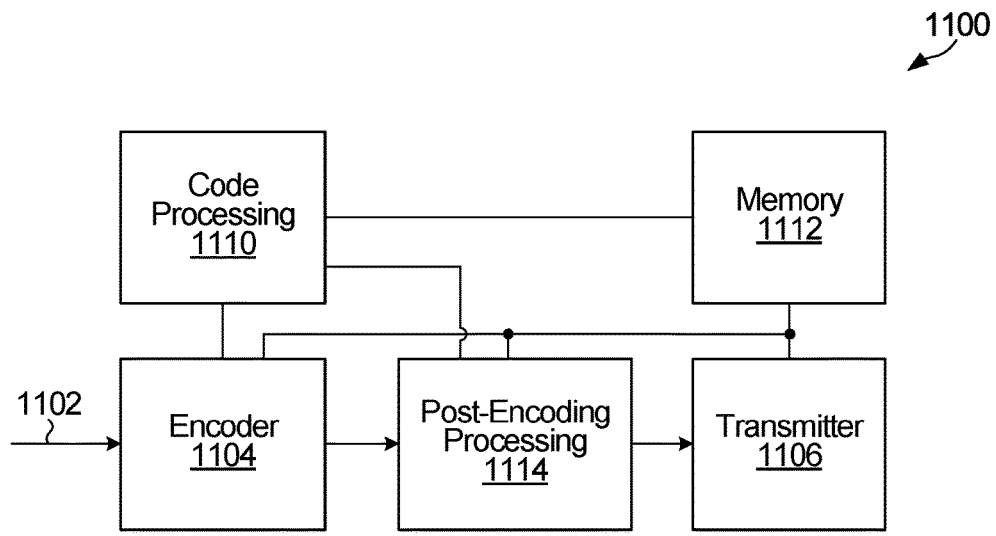
FIG. 11 is a block diagram of an apparatus for encoding and transmitting codewords.

FIG. 11 is a block diagram of an apparatus for encoding and transmitting codewords. The apparatus 1100 includes an encoder module 1104 coupled to a transmitter module 1106. The apparatus 1100 also includes a code processing module 1110 coupled to the encoder module 1104 and to a post-encoding processing module 1114. The post-encoding processing module 1114 is also coupled to the encoder module 1104 and to the transmitter module 1106. A memory 1112, also shown in FIG. 11, is coupled to the encoder module 1104, to the code processing module 1110, to the post-encoding processing module 1114, and to the transmitter module 1106. Although not shown, the transmitter module 1106 could include a modulator, an amplifier, an antenna and/or other modules or components of a transmit chain or alternatively could be configured to interface with a separate (Radio-Frequency—RF) transmission module. For example, some or all of the modules 1104, 1106, 1110, 1112, 1114 of the apparatus 1100 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the memory 1112 is a non-transitory computer readable medium that includes instructions for execution by a processor to implement and/or control operation of the code processing module 1110, the encoder module 1104, the post-encoding processing module 1114, the transmitter module 1106 in FIG. 11, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1112.

In some embodiments, the encoder module 1104 is implemented in circuitry, such as a processor, that is configured to encode information symbols that are received at the input 1102 as disclosed herein. In a processor-based implementation of the encoder module 1104, processor-executable instructions to configure a processor to perform encoding operations are stored in a non-transitory processor-readable medium. The non-transitory medium could include, in the memory 1112 for example, one or more solid-state memory devices and/or memory devices with movable and possibly removable storage media.

In an embodiment, the processor or encoder 1104 is configured to determine a code configuration parameter of a polar code; to determine, based on the determined code configuration parameter, encoding graph parameters that identify inputs for one or more kernel operations in each of multiple encoding layers; and to encode the information symbols to generate a codeword by applying the one or more kernel operations to the inputs of each encoding layer in accordance with the determined encoding graph parameters.

The code processing module 1110 could be implemented in circuitry that is configured to determine coding parameters such as mother code block length, and to determine an ordered sub-channel sequence. In some embodiments, the code processing module 1110 is implemented using a processor. The same processor or other circuitry, or separate processors or circuitry, could be used to implement both the encoder module 1104 and the code processing module 1110. As noted herein for the encoder module 1104, in a processor-based implementation of the code processing module 1110, processor-executable instructions to configure a processor to perform code processing operations are stored in a non-transitory processor-readable medium, in the memory 1112 for example.

Like the encoder module 1104 and the code processing module 1110, the post-encoding processing module 1114 is implemented in circuitry, such as a processor, that is configured to perform various post-encoding operations. These post-encoding operations could include rate-matching operations such as puncturing, shortening and/or interleaving, and illustrative examples of such operations that could be implemented in conjunction with encoding are described below. In a processor-based implementation of the post-encoding processing module 1114, processor-executable instructions to configure a processor to perform post-encoding operations are stored in a non-transitory processor-readable medium, examples of which are described herein. In an embodiment, the post-encoding processing module 1114 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 1110, stored to the memory 1112, or otherwise made available to the code processing module 1110 by the post-encoding processing module 1114.

The apparatus 1100 could implement any of various other features that are disclosed herein. For example, the encoder module 1104, the transmitter module 1106, the code processing module 1110, and/or the post-encoding processing module 1114 could be configured to implement any one or more of the features listed or otherwise described herein. By way of example, any one or more of the following could be provided, alone or in any of various combinations, in embodiments:

the encoder, or a processor in a processor-based embodiment, is configured to determine a code configuration parameter by determining one or more of mother code length N and information block length K;

the encoding graph parameters include a number of encoding layers m and, for each of the encoding layers, a starting point $s_i$ identifying a position of a first input of an encoding layer i, $1 \leq i \leq m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied;

m is a function of N and $(s_i, d_i)$ are functions of i;

the encoder, or a processor in a processor-based embodiment, is configured to determine the encoding graph parameters in accordance with:

$$m = N-1$$

$$\text{For } \forall i,\ 2^k \leq i < 2^{k+1}$$

$$d_i = 2^k$$

$$s_i = 2d - i - 1;$$

m is a function of N and $(s_i, d_i)$ are functions of N and i;

the encoder, or a processor in a processor-based embodiment, is configured to determine the encoding graph parameters in accordance with:

$$m = 3N/2 - 2$$

$$\text{For } \forall i,\ d_i = \begin{cases} 2^{k-1} & \text{if } 2^k - 1 \leq i < 2^{k+1} - 1 \text{ and } i \leq N - 2 \\ \dfrac{N}{2} & \text{if } N - 2 < i \leq \dfrac{3N}{2} - 2 \end{cases},$$

$$s_i = \begin{cases} 2^{k+1} - i - 2 & \text{if } 2^k - 1 \leq i < 2^{k+1} - 1 \text{ and } i \leq N - 2 \\ \dfrac{3N}{2} - i - 2 & \text{if } N - 2 < i \leq \dfrac{3N}{2} - 2, \end{cases};$$

m is a function of K and N and $(s_i, d_i)$ are functions of K and i;

the encoder, or a processor in a processor-based embodiment, is configured to determine the encoding graph parameters based in part on an integer $\alpha \leq \lfloor \log_2 K \rfloor$ and in accordance with:

$$m = 2^{\lfloor \log_2 K \rfloor - \alpha}(N-1)$$

$$\text{For } \forall i,\ 2^{k + \lfloor \log_2 K \rfloor - \alpha} - 2^{\lfloor \log_2 K \rfloor - \alpha} + 1 \leq i \leq 2^{k+1+\lfloor \log_2 K \rfloor - \alpha} - 2^{\lfloor \log_2 K \rfloor - \alpha}$$

$$d_i = 2^k$$

$$s_i = 2^{k+1} i - 1;$$

m is a function of K and N and $(s_i, d_i)$ are functions of K, N and i;

the encoder, or a processor in a processor-based embodiment, is configured to determine the encoding graph parameters based in part on an integer $\alpha \leq \lfloor \log_2 K \rfloor$ and in accordance with:

$$m = 2^{\lfloor \log_2 K \rfloor - \alpha}(3N/2 - 2)$$

For $\forall i$, $$d_i = \begin{cases} 2^{k-1} & \text{if } \begin{array}{l} 2^{k+\lfloor \log_2 K \rfloor - \alpha} - 2^{\lfloor \log_2 K \rfloor - \alpha + 1} < i \le 2^{k+\lfloor \log_2 K \rfloor - \alpha + 1} - \\ 2^{\lfloor \log_2 K \rfloor - \alpha + 1} \text{ and } i \le 2^{\lfloor \log_2 K \rfloor - \alpha}(N-2) \end{array} \\ \dfrac{N}{2} & \text{if } 2^{\lfloor \log_2 K \rfloor - \alpha}(N-2) < i \le 2^{\lfloor \log_2 K \rfloor - \alpha}(3N/2 - 2) \end{cases},$$

$$s_i = \begin{cases} 2^{k+1} - i - 2 & \text{if } \begin{array}{l} 2^{k+\lfloor \log_2 K \rfloor - \alpha} - 2^{\lfloor \log_2 K \rfloor - \alpha + 1} < i \le 2^{k+\lfloor \log_2 K \rfloor - \alpha + 1} - \\ 2^{\lfloor \log_2 K \rfloor - \alpha + 1} \text{ and } i \le 2^{\lfloor \log_2 K \rfloor - \alpha}(N-2) \end{array} \\ \dfrac{3N}{2} - i - 2 & \text{if } 2^{\lfloor \log_2 K \rfloor - \alpha}(N-2) < i \le 2^{\lfloor \log_2 K \rfloor - \alpha}(3N/2 - 2), \end{cases};$$

the one or more kernel operations are associated with a binary or non-binary Arikan kernel;

the one or more kernel operations include more than one kernel operation in at least one of the multiple encoding layers;

the one or more kernel operations include more than one kernel operation in each of the multiple encoding layers;

user equipment includes such an apparatus;

communication network equipment includes such an apparatus.

In some alternative embodiments, the functionality of the encoder module 1104, the transmitter module 1106, the code processing module 1110, and/or the post-encoding processing module 1114 described herein may be fully or partially implemented in hardware or alternatively in software, for example in modules stored in a memory such as 1112 and executed by one or more processors of the apparatus 1100.

An apparatus could therefore include a processor, and a memory such as 1112, coupled to the processor, storing instructions which, when executed by the processor, cause the processor to perform the functionality and/or embodiments described herein in relation to the encoder module 1104, the transmitter module 1106, the code processing module 1110, and/or the post-encoding module 1114 described herein. In an embodiment, an apparatus includes a processor and a non-transitory computer-readable medium, coupled to the processor, storing instructions which, when executed by the processor, cause the processor to perform a method that involves: determining a code configuration parameter of a polar code; determining, based on the determined code configuration parameter, encoding graph parameters that identify inputs for one or more kernel operations in each of multiple encoding layers; encoding information symbols by applying the one or more kernel operations to the inputs identified in each encoding layer in accordance with the determined encoding graph parameters. Any one or more of the features listed above or otherwise disclosed herein could be provided, alone or in any of various combinations, in embodiments that involve a non-transitory computer-readable medium.

Figure 12:
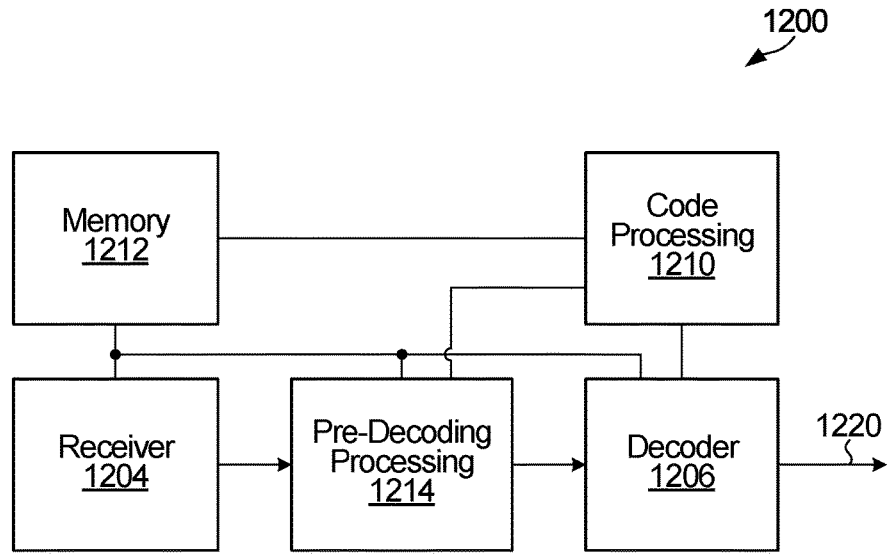
FIG. 12 is a block diagram of an example apparatus for receiving and decoding codewords.

FIG. 12 is a block diagram of an example apparatus for receiving and decoding codewords. The apparatus 1200 includes a receiver module 1204 which is configured to receive signals transmitted wirelessly and which is coupled to a decoder module 1206. The apparatus 1200 also includes a code processing module 1210 coupled to the decoder module 1206 and to a pre-decoding processing module 1214. The pre-decoding processing module 1214 is also coupled to the decoder module 1206 and to the receiver module 1204. A memory 1212 also shown in FIG. 12, is coupled to the decoder module 1206, to the code processing module 1210, to the receiver module 1204, and to the pre-decoding processing module 1214.

Although not shown, the receiver module 1204 could include an antenna, demodulator, amplifier, and/or other modules or components of a receive chain or alternatively could be configured to interface with a separate (Radio-Frequency—RF) receiving module. For example, some or all of the modules 1204, 1206, 1210, 1212, 1214 of the apparatus 1200 may be implemented in hardware or circuitry (e.g. in one or more chipsets, microprocessors, ASICs, FPGAs, dedicated logic circuitry, or combinations thereof) so as to receive a word based on a codeword of a polar code as described herein. Decoded bits are output at 1220 for further receiver processing.

In some embodiments, the memory 1212 is a non-transitory computer readable medium that includes instructions for execution by a processor to implement and/or control operation of the receiver module 1204, decoder module 1206, the code processing module 1210, and the pre-decoding processing module 1214 in FIG. 12, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1212.

The decoder module 1206 is implemented in circuitry, such as a processor, that is configured to decode received codewords as disclosed herein, using SC decoding, for example. In a processor-based implementation of the decoder module 1206, processor-executable instructions to configure a processor to perform decoding operations are stored in a non-transitory processor-readable medium. The non-transitory medium could include, in the memory 1212 for example, one or more solid-state memory devices and/or memory devices with movable and possibly removable storage media.

The code processing module 1210 is implemented in circuitry that is configured to determine (and store to the memory 1212) ordered sub-channel sequences and use those sequences in decoding received words. In a processor-based implementation of the code-processing module 1210, processor-executable instructions to configure a processor to perform code-processing operations are stored in a non-transitory processor-readable medium, examples of which are described herein. Information representing ordered sub-channel sequences, and/or the selected sub-channels, could be provided to the decoder module 1206 by the code processing module 1210 for use in decoding received words, and/or stored in the memory 1212 by the code processing module 1210 for subsequent use by the decoder module 1206.

Like the decoder module 1206 and the code processing module 1210, the pre-decoding processing module 1214 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/ shortening that was applied at an encoder/transmitter side, and examples are provided herein. In a processor-based implementation of the pre-decoding processing module 1214, processor-executable instructions to configure a processor to perform pre-decoding processing operations are stored in a non-transitory processor-readable medium, examples of which are described herein. In an embodiment, the pre-decoding processing module 1214 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 1210, stored to the memory 1212, or otherwise made available to the code processing module 1210 by the pre-decoding processing module 1214.

In some alternative embodiments, the functionality of the receiver module 1204, the decoder module 1206, the code processing module 1210, and/or the pre-decoding processing module 1214 described herein may be fully or partially implemented in software or modules, for example in receiving and decoding modules stored in a memory 1212 and executed by one or more processors of the apparatus 1200.

An apparatus could therefore include a processor, and a memory such as 1212, coupled to the processor, storing instructions which, when executed by the processor, cause the processor to perform the functionality and/or embodiments disclosed herein, or receiving/decoding operations corresponding to transmitting/encoding operations disclosed herein.

The apparatus 1200 could implement any of various other features that are disclosed herein. For example, the decoder module 1206, the receiver module 1204, the code processing module 1210, and/or the pre-decoding processing module 1214 could be configured to implement any one or more of receiving/decoding features corresponding to encoding/transmitting features noted herein.

Figure 13:
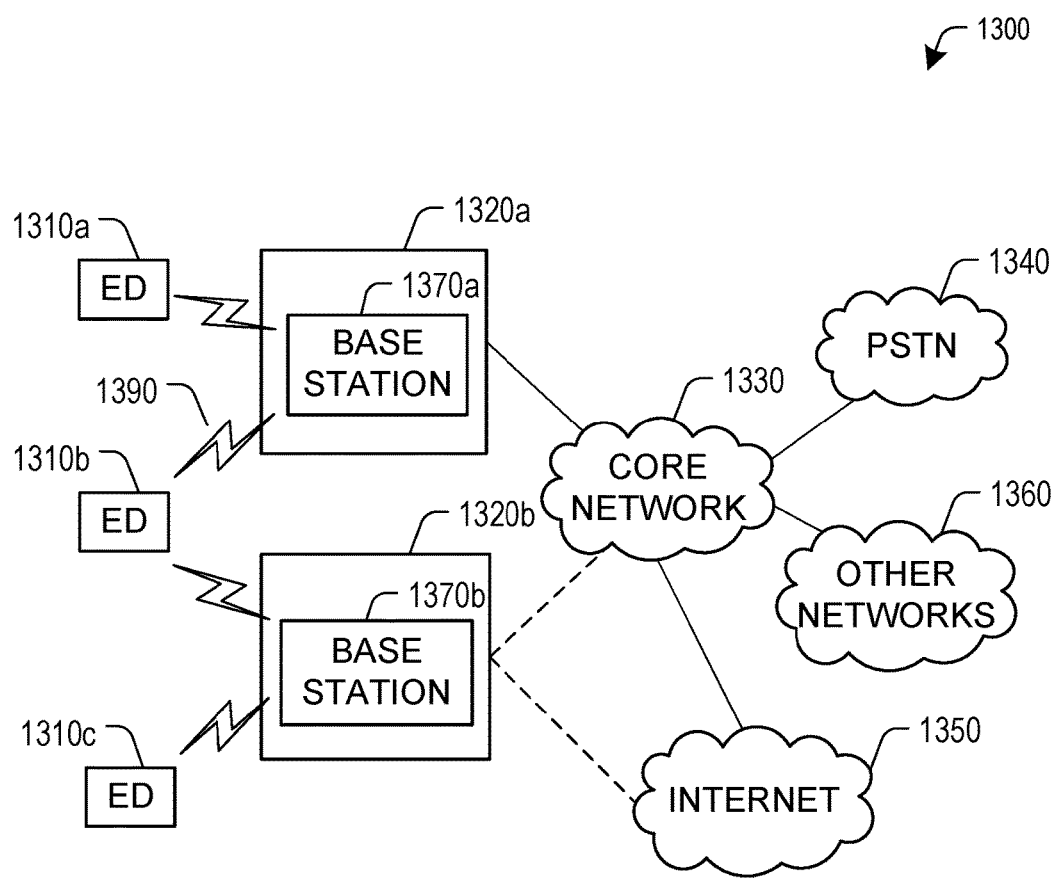
FIG. 13 is a block diagram of an example communication system in which embodiments disclosed herein may be used.

FIG. 13 illustrates an example communication system 1300 in which embodiments of the present disclosure could be implemented. In general, the communication system 1300 enables multiple wireless or wired elements to communicate data and other content. The purpose of the communication system 1300 may be to provide content (voice, data, video, text) via broadcast, narrowcast, user device to user device, etc. The communication system 1300 may operate by sharing resources such as bandwidth.

In this example, the communication system 1300 includes electronic devices (ED) 1310a-1310c, radio access networks (RANs) 1320a-1320b, a core network 1330, a public switched telephone network (PSTN) 1340, the internet 1350, and other networks 1360. Although certain numbers of these components or elements are shown in FIG. 13, any reasonable number of these components or elements may be included.

The EDs 1310a-1310c and base stations 1370a-1370b are examples of communication equipment that can be configured to implement some or all of the functionality and/or embodiments described herein. For example, any one of the EDs 1310a-1310c and base stations 1370a-1370b could be configured to implement the encoding or decoding functionality (or both) described herein. In another example, any one of the EDs 1310a-1310c and base stations 1370a-1370b could include the apparatus 1100, the apparatus 1200, or both, described herein in relation to FIGS. 11 and 12.

The EDs 1310a-1310c are configured to operate, communicate, or both, in the communication system 1300. For example, the EDs 1310a-1310c are configured to transmit, receive, or both via wireless or wired communication channels. Each ED 1310a-1310c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 13, the RANs 1320a-1320b include base stations 1370a-1370b, respectively. Each base station 1370a-1370b is configured to wirelessly interface with one or more of the EDs 1310a-1310c to enable access to any other base station 1370a-1370b, the core network 1330, the PSTN 1340, the Internet 1350, and/or the other networks 1360. For example, the base stations 1370a-1370b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 1310a-1310c may be alternatively or additionally configured to interface, access, or communicate with any other base station 1370a-1370b, the internet 1350, the core network 1330, the PSTN 1340, the other networks 1360, or any combination of the preceding. The communication system 1300 may include RANs, such as RAN 1320b, wherein the corresponding base station 1370b accesses the core network 1330 via the internet 1350, as shown.

The EDs 1310a-1310c and base stations 1370a-1370b are examples of communication equipment that can be configured to implement some or all of the functionality and/or embodiments described herein. In the embodiment shown in FIG. 13, the base station 1370a forms part of the RAN 1320a, which may include other base stations, base station controller(s) (BSC), radio network controller(s) (RNC), relay nodes, elements, and/or devices. Any base station 1370a, 1370b may be a single element, as shown, or multiple elements, distributed in the corresponding RAN, or otherwise. Also, the base station 1370b forms part of the RAN 1320b, which may include other base stations, elements, and/or devices. Each base station 1370a-1370b transmits and/or receives wireless signals within a particular geographic region or area, sometimes referred to as a "cell" Or "coverage area". A cell may be further divided into cell sectors, and a base station 1370a-1370b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 1320a-1320b shown is exemplary only. Any number of RAN may be contemplated when devising the communication system 1300.

The base stations 1370a-1370b communicate with one or more of the EDs 1310a-1310c over one or more air interfaces 1390 using wireless communication links e.g. radio frequency (RF), microwave, infrared (IR), etc. The air interfaces 1390 may utilize any suitable radio access technology. For example, the communication system 1300 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1390.

A base station 1370a-1370b may implement Universal Mobile Telecommunication System (UMTS) Terrestrial Radio Access (UTRA) to establish an air interface 1390 using wideband CDMA (WCDMA). In doing so, the base station 1370a-1370b may implement protocols such as HSPA, HSPA+ optionally including HSDPA, HSUPA or both. Alternatively, a base station 1370a-1370b may establish an air interface 1390 with Evolved UTMS Terrestrial Radio Access (E-UTRA) using LTE, LTE-A, and/or LTE-B. It is contemplated that the communication system 1300 may use multiple channel access functionality, including such schemes as described herein. Other radio technologies for implementing air interfaces include IEEE 802.11, 802.15, 802.16, CDMA2000, CDMA2000 1×, CDMA2000 EV-DO, IS-2000, IS-95, IS-856, GSM, EDGE, and GERAN. Of course, other multiple access schemes and wireless protocols may be utilized.

The RANs 1320a-1320b are in communication with the core network 1330 to provide the EDs 1310a-1310c with various services such as voice, data, and other services. The RANs 1320a-1320b and/or the core network 1330 may be in direct or indirect communication with one or more other RANs (not shown), which may or may not be directly served by core network 1330, and may or may not employ the same radio access technology as RAN 1320a, RAN 1320b or both. The core network 1330 may also serve as a gateway access between (i) the RANs 1320a-1320b or EDs 1310a-1310c or both, and (ii) other networks (such as the PSTN 1340, the internet 1350, and the other networks 1360). In addition, some or all of the EDs 1310a-1310c may include functionality for communicating with different wireless networks over different wireless links using different wireless technologies and/or protocols. Instead of wireless communication (or in addition thereto), the EDs 1310a-1310c may communicate via wired communication channels to a service provider or switch (not shown), and to the internet 1350. PSTN 1340 may include circuit switched telephone networks for providing plain old telephone service (POTS). Internet 1350 may include a network of computers and subnets (intranets) or both, and incorporate protocols, such as IP, TCP, UDP. EDs 1310a-1310c may be multimode devices capable of operation according to multiple radio access technologies, and incorporate multiple transceivers necessary to support such.

Figure 14A:
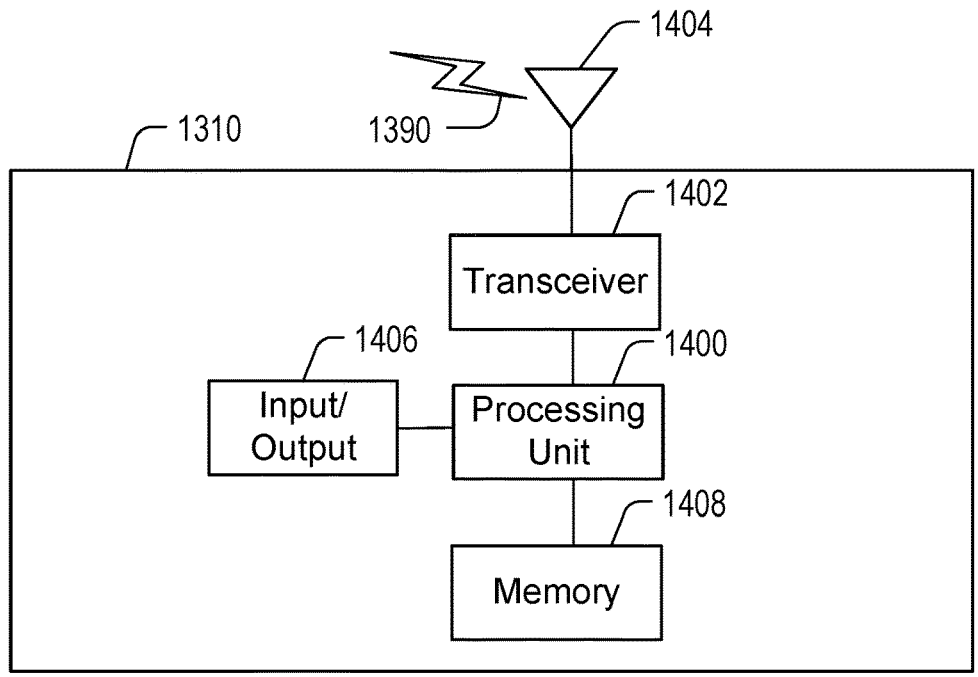
FIGS. 14A-B are block diagrams of an example Electronic Device (ED) and an example base station which may implement embodiments disclosed herein.
Figure 14B:
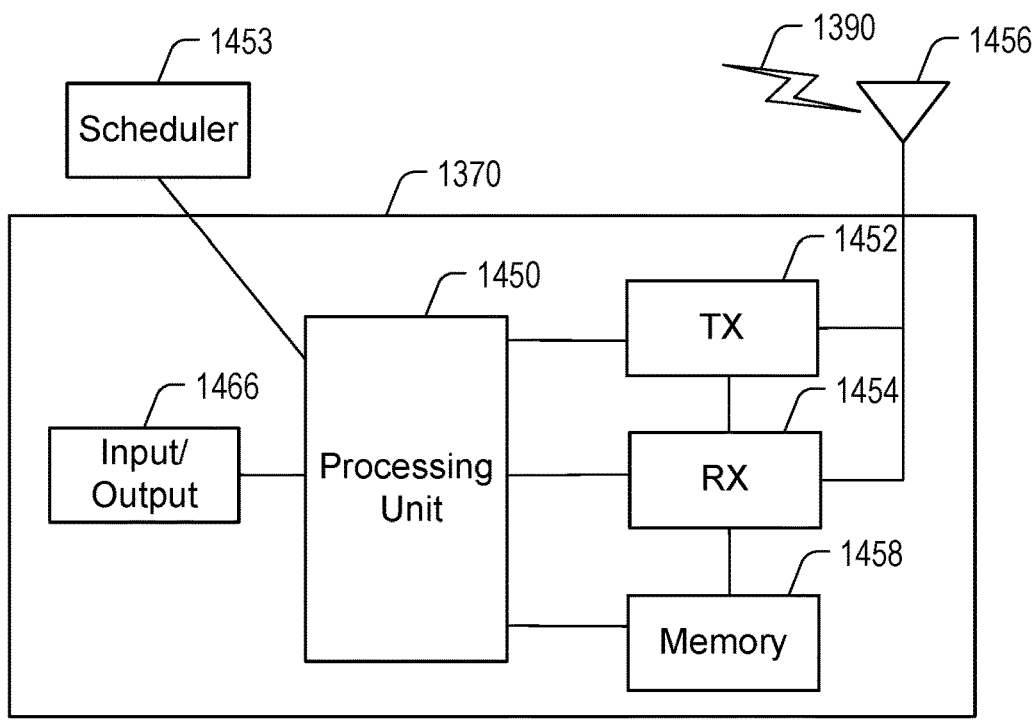

FIGS. 14A and 14B illustrate example devices that may implement the methods and teachings according to this disclosure. In particular, FIG. 14A illustrates an example ED 1310, and FIG. 14B illustrates an example base station 1370. These components could be used in the communication system 1300 or in any other suitable system.

As shown in FIG. 14A, the ED 1310 includes at least one processing unit 1400. The processing unit 1400 implements various processing operations of the ED 1310. For example, the processing unit 1400 could perform signal coding, data processing, power control, input/output processing, or any other functionality enabling the ED 1310 to operate in the communication system 1300. The processing unit 1400 may also be configured to implement some or all of the functionality and/or embodiments described in more detail herein. Each processing unit 1400 includes any suitable processing or computing device configured to perform one or more operations. Each processing unit 1400 could, for example, include a microprocessor, microcontroller, digital signal processor, field programmable gate array, or application specific integrated circuit.

The ED 1310 also includes at least one transceiver 1402. The transceiver 1402 is configured to modulate data or other content for transmission by at least one antenna or Network Interface Controller (NIC) 1404. The transceiver 1402 is also configured to demodulate data or other content received by the at least one antenna 1404. Each transceiver 1402 includes any suitable structure for generating signals for wireless or wired transmission and/or processing signals received wirelessly or by wire. Each antenna 1404 includes any suitable structure for transmitting and/or receiving wireless or wired signals. One or multiple transceivers 1402 could be used in the ED 1310, and one or multiple antennas 1404 could be used in the ED 1310. Although shown as a single functional unit, a transceiver 1402 could also be implemented using at least one transmitter and at least one separate receiver.

The ED 1310 further includes one or more input/output devices 1406 or interfaces (such as a wired interface to the internet 1350). The input/output devices 1406 permit interaction with a user or other devices in the network. Each input/output device 1406 includes any suitable structure for providing information to or receiving information from a user, such as a speaker, microphone, keypad, keyboard, display, or touch screen, including network interface communications.

In addition, the ED 1310 includes at least one memory 1408. The memory 1408 stores instructions and data used, generated, or collected by the ED 1310. For example, the memory 1408 could store software instructions or modules configured to implement some or all of the functionality and/or embodiments described herein and that are executed by the processing unit(s) 1400. Each memory 1408 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 14B, the base station 1370 includes at least one processing unit 1450, at least one transmitter 1452, at least one receiver 1454, one or more antennas 1456, at least one memory 1458, and one or more input/output devices or interfaces 1466. A transceiver, not shown, may be used instead of the transmitter 1452 and receiver 1454. A scheduler 1453 may be coupled to the processing unit 1450. The scheduler 1453 may be included within or operated separately from the base station 1370. The processing unit 1450 implements various processing operations of the base station 1370, such as signal coding, data processing, power control, input/output processing, or any other functionality. The processing unit 1450 can also be configured to implement some or all of the functionality and/or embodiments described in more detail herein. Each processing unit 1450 includes any suitable processing or computing device configured to perform one or more operations. Each processing unit 1450 could, for example, include a microprocessor, microcontroller, digital signal processor, field programmable gate array, or application specific integrated circuit.

Each transmitter 1452 includes any suitable structure for generating signals for wireless or wired transmission to one or more EDs or other devices. Each receiver 1454 includes any suitable structure for processing signals received wirelessly or by wire from one or more EDs or other devices. Although shown as separate components, at least one transmitter 1452 and at least one receiver 1454 could be combined into a transceiver. Each antenna 1456 includes any suitable structure for transmitting and/or receiving wireless or wired signals. Although a common antenna 1456 is shown here as being coupled to both the transmitter 1452 and the receiver 1454, one or more antennas 1456 could be coupled to the transmitter(s) 1452, and one or more separate antennas 1456 could be coupled to the receiver(s) 1454. Each memory 1458 includes any suitable volatile and/or non-volatile storage and retrieval device(s) such as those described herein in connection to the ED 1310. The memory 1458 stores instructions and data used, generated, or collected by the base station 1370. For example, the memory 1458 could store software instructions or modules configured to implement some or all of the functionality and/or embodiments described herein and that are executed by the processing unit(s) 1450.

Each input/output device 1466 permits interaction with a user or other devices in the network. Each input/output device 1466 includes any suitable structure for providing information to or receiving/providing information from a user, including network interface communications.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted herein, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

Any of various operations could be implemented in conjunction with encoding and decoding. Examples of such operations are described in further detail below, and in at least some cases could be implemented as post-encoding or pre-decoding operations.

Although the typical code length of a layered polar code is usually limited to $2^n$ (or $L^n$), rate matching techniques could be employed to obtain arbitrary information and code block lengths. Puncturing and shortening are two of the most common methods to design rate-matched codes.

To design a rate-matched $(K,M,N=2^n)$ layered polar code, puncturing could be employed to puncture $N-M$ code bits. The punctured code bits are equivalently assumed to have been transmitted over a zero-capacity channel and a zero Log Likelihood Ratio (LLR) is fed to the decoder. Any of several puncturing algorithms could be applied for layered polar codes. An example general procedure to design a rate-matched layered polar code using puncturing is as follows:

Code Construction Using Puncturing

Step 1) Obtain a reliability sequence $Q=\{Q_0, Q_1, \ldots, Q_{N-1}\}$ to rank the sub-channels in ascending (or descending) reliability. Generally high reliability sub-channels are used to carry the information bits and low reliability sub-channels are frozen.

Step 2) Choose $P=N-M$ code bits to puncture using a puncturing algorithm, examples of which are provided below.

Step 3) Choose P' sub-channels to freeze. Puncturing P code bits makes some of the sub-channels disabled (zero-capacity). Disabled sub-channels should be frozen. Employ an algorithm to find the P' sub-channels to freeze.

Step 4) Use the most reliable sub-channels as information sub-channels starting from the last element of Q towards the first element (for an ascending reliability sequence) or from the first element of Q towards the last element (for a descending reliability sequence), skipping the P' disabled sub-channels. Set the rest of sub-channels as frozen (N-K sub-channels).

Illustrative examples of puncturing algorithms include the following, although others are also possible:

Natural Puncturing

Puncture the first P code bits $c_0, c_1, \ldots, c_{P-1}$

BIV Puncturing

Puncture code bits with indices of the bit-reversal transformation of $0, 1, \ldots, P-1$. That is, puncture $c_{\pi(0)}, c_{\pi(1)}, \ldots, c_{\pi(P-1)}$. The function $\pi(k)$ is defined as follows. Find the binary representation of k as $k_{n-1}, k_{n-2} \ldots k_1 k_0$. Reverse the binary representation to get $k_0 k_1 \ldots k_{n-2} k_{n-1}$. $\pi(k)$ is equal to the decimal representation of $k_0 k_1 \ldots k_{n-2} k_{n-1}$.

Reliability-Based Puncturing

Puncture in the same order as the reliability sequence Q. That is, puncture in the order of $c_{Q_0}, c_{Q_1}, \ldots, C_{Q_{P-1}}$.

Shortening could also or instead be used to design a rate-matched $(K, M, N=2^n)$ layered polar code by shortening to $N-M$ code bits. This is done by freezing some of the sub-channels in such a way that makes some code bits deterministically zero-valued. These code bits are referred to as shortened code bits. Since the value of the shortened code bits is always zero, the transmitter need not transmit them on the channel so in one sense they are in effect punctured. Unlike puncturing, the decoder uses a $+\infty$ LLR for the shortened code bits as it knows their values with full certainty. Several shortening algorithms could be applied for layered polar codes. An example general procedure to design a rate-matched layered polar code using shortening is as follows:

Code Construction Using Shortening

Step 1) Obtain a reliability sequence $Q=\{Q_0, Q_1, \ldots, Q_{N-1}\}$ to rank the sub-channels in ascending (or descending) reliability. Generally high reliability sub-channels are used to carry the information bits and low reliability sub-channels are frozen.

Step 2) Choose P' sub-channels to freeze such that P=N−M code bits become shortened. The P' sub-channels are referred to herein as recoverable sub-channels. The recoverable sub-channels and shortened code bits can be selected using a shortening algorithm, an example of which is provided below.

Step 2) Shorten the P code bits. These code bits will not be transmitted over the channel.

Step 4) Use the most reliable sub-channels as information sub-channel starting from the last element of Q towards the first element (or from first to last element for a sequence in decreasing order of reliability), skipping the P' recoverable sub-channels. Set the rest of sub-channels as frozen (N−K sub-channels).

Natural shortening is an illustrative example of a shortening algorithm. In natural shortening, the last P'=P=N−M sub-channels in an increasing reliability sequence and shorten the last P code bits $C_{N-P}, C_{N-P+1}, \ldots, C_{N-1}$.

Extending is another important method to design rate-matched layered polar codes. To design a (K, M, N) rate-matched layered polar code using extending, a rate-matched (K, M', N) code (M'≤M) is first constructed using either puncturing or shortening. Having designed a rate-matched code, an extra set of E=M−M' new code symbols are generated via extending. The following is an example of how the extending could be carried out in an embodiment.

Recall that a layered polar code is constructed by applying m encoding layers to the input vector $u=[u_0, u_1, \ldots, U_{N-1}]$. Let $c^{(i)}=[c_0^{(i)}, c_0^{(i)}, \ldots, c_{N-1}^{(i)}]$ be the output of layer i. The output of layer m, $c^{(m)}$ is the codeword itself which is (possibly) punctured or shortened. However the output of all layers is a linear combination of the input symbols $u_i$, and therefore can be considered as possible code symbols to transmit over the channel. An extended (K, M, N) layered polar code could be obtained from a (K, M', N) layered polar code by transmitting a set of E code symbols from the outputs of all layers. That is, a set of E code symbols $\{c_{j_1}^{(i_1)}, c_{j_2}^{(i_2)}, c_{j_3}^{(i_3)}, \ldots, c_{j_E}^{(i_E)}\}$ could be chosen, where $1 \le i_1, i_2, \ldots, i_E \le m$ and $0 \le j_1, j_2, \ldots, j_E < N$. These code symbols are referred to herein as extended code symbols.

Decoding an extended layered polar code can be performed as follows in an embodiment. First, all of the multiple transmitted code symbols are processed, using Maximum-Ratio Combining (MRC) for example, to obtain one single LLR for those symbols. Decoding is then performed in the same way as for a non-extended code, with a difference being that when calculating the LLR of intermediate symbols, the decoder adds the channel LLR obtained by transmission of the extended symbol to the calculated LLR before proceeding with the rest of decoding.

Hybrid Automatic Repeat Request (HARQ) schemes could be used with layered polar codes. Several examples are described below. Consider transmission of K information symbols using a possibly rate-matched code of length M obtained from a mother code of length (M≤N). A HARQ scheme attempts to transmit redundancy symbols in T (re)-trasnmissions. The transmission will stop once an acknowledgement (ACK) is received at the transmitter from the receiver announcing a successful decoding.

A Chase combining HARQ (CC-HARQ) scheme encodes K information bits to generate a codeword c of length M and sends the same codeword c in all T transmissions. At the decoder side, MRC is used to combine the LLRs of all transmissions and perform one single decoding of the first transmitted code.

With Incremental Redundancy HARQ (IR-HARQ), the first transmission involves transmitting the (K, M, N) code over the channel. For the second transmission, $E_1$ new code symbols $$\{c_{j_1}^{(i_1)}, c_{j_2}^{(i_2)}, c_{j_3}^{(i_3)}, \ldots, c_{j_{E_1}}^{(i_{E_1})}\}$$

are chosen from the outputs of all m layers of the code and sent over the channel resulting in an effective rate $$\frac{K}{M+E_1}.$$

If the decoding of the new code is successful an ACK is sent back to the transmitter and transmission is complete. Otherwise $E_2$ new code symbols $$\{c_{j_1}^{(i_1)}, c_{j_2}^{(i_2)}, c_{j_3}^{(i_3)}, \ldots, c_{j_{E_2}}^{(i_{E_2})}\}$$

are transmitted resulting in an effective rate $$\frac{K}{M+E_1+E_2}.$$

This process continues until the T-th transmission is done at the end of which the effective rate will become $$\frac{K}{M+\sum_{k=1}^{T} E_k}.$$

Incremental Freezing HARQ (IF-HARQ) is a special type of IR-HARQ where at every retransmission some of the least reliable information bits are retransmitted using a different polar code. To be more specific, consider a (K, M, N) mother code. This code is transmitted over the channel and decoding is attempted at the receiver. If decoding fails, the transmitter takes $K_1$ least reliable information bits and encodes them with a different polar code ($K_1$, $M_1$, $N_1$) such that $$\frac{K_1}{M_1} < \frac{K}{M},$$

i.e. the transmission rate is reduced assuming that the channel was not good enough and the first decoding has not been successful. The decoder decodes the second code to recover the $K_1$ information bits. If this is successful, then the decoder uses those decoded bits as frozen bits for the first code and performs decoding of the first code. Otherwise, a third transmission takes place by sending $K_2$ least reliable information bits from the second transmission and the first retransmission using a ($K_2$, $M_2$, $N_2$) code such that $$\frac{K_2}{M_2} < \frac{K_1}{M_1}.$$

If decoding of this new code succeeds, then the decoded $K_2$ bits are treated as frozen bits to perform decoding of the third transmission and after that the second transmission. If not, $K_3$ least reliable information bits from the previous transmission are chosen for transmission over channel using a ($K_3$, $M_3$, $N_3$) such that $$\frac{K_3}{M_3} < \frac{K_2}{M_2}.$$

This process continues until decoding of all transmitted codes are successful or a maximum number of transmissions T is reached. The effective rate after T retransmission is $$\frac{K}{M + \sum_{k=1}^{T} M_k}.$$

Figure 15:
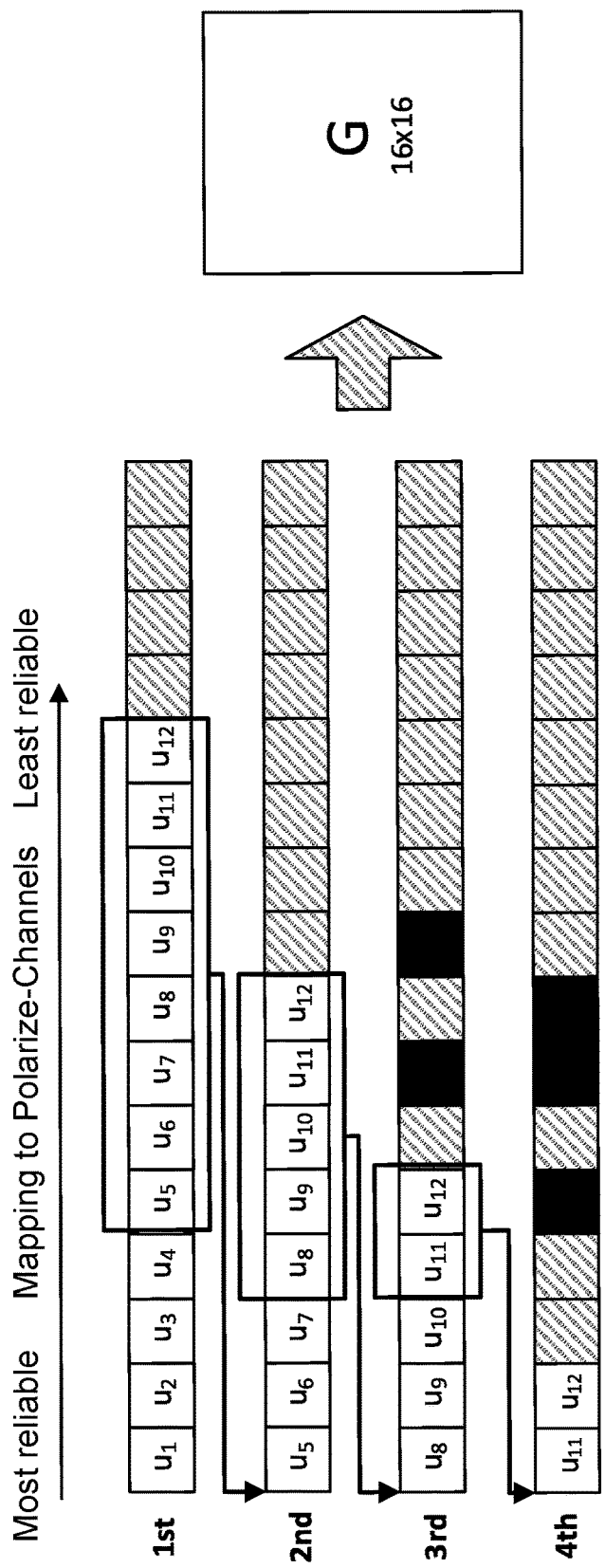
FIG. 15 is a block diagram illustrating an example of Incremental Freezing HARQ (IF-HARQ).

FIG. 15 is a block diagram illustrating an example of IF-HARQ with (K, M, N)=(12,16,16), ($K_1$, $M_1$, $N_1$)=(8,16,16), ($K_2$, $M_2$, $N_2$)=(5,14,16), ($K_3$, $M_3$, $N_3$)=(2,13,16), and T=3 retransmissions. A black box indicates a punctured bit in FIG. 15.

By employing multiple transmit and receive antennas, Multiple-Input Multiple Output (MIMO) systems increase the capacity of wireless channel and therefore have been adopted to various wireless standards. A MIMO channel with $N_t$ transmit and $N_r$ receive antenna can be modeled as $$y = Hx + n,$$

where $$y = \begin{bmatrix} y_1 \\ , \\ \vdots \\ , \\ y_{N_r} \end{bmatrix}, H = [h_{i,j}]_{N_r \times N_t}, X = \begin{bmatrix} x_1 \\ , \\ \vdots \\ , \\ x_{N_t} \end{bmatrix} \text{ and } n = \begin{bmatrix} n_1 \\ , \\ \vdots \\ , \\ n_{N_r} \end{bmatrix}.$$

$x_i$ is the transmitted signal at transmit antenna i, $y_i$ is the received signal at the receive antenna i. The $n_i$ are i.i.d. zero-mean complex Gaussian additive noise at the i-th receive antenna, and the $h_{i,j}$ are i.i.d. zero-mean unit-variance complex Gaussian random variables determining the gain from transmit antenna j to the receive antenna i. The transmitted symbols $x_j$ come from a constellation with modulation order q. A MIMO transmitter sends $qN_t$ binary bits $a_1, a_2, \ldots a_{qN_t}$ by transmitting $x_1, x_2 \ldots, x_{N_t}$ symbols over the channel. A hard MIMO receiver estimates the transmitted symbols and bits as $\hat{x}_1, \hat{x}_2, \ldots, \hat{x}_{N_t}$ and $\hat{a}_1, \hat{a}_2 \ldots \hat{a}_{qN_t}$ from the received $y_1, y_2 \ldots y_{N_r}$. Alternatively, a soft MIMO receiver calculates a posteriori LLRs $\lambda_i$ of the transmitted bit $a_i$ from the received vector y.

With a coherent MIMO channel, the channel coefficients $h_{i,j}$ are known at the receiver and are used for recovering the transmitted bits. A soft coherent MIMO receiver calculates the LLRs as $$\lambda_i = \log \frac{Pr(a_i = 0 \mid y, H)}{Pr(a_i = 1 \mid y, H)}.$$

The knowledge of $h_{i,j}$ could be obtained using any of several methods, including pilot transmission for example.

With Non-coherent MIMO channel, the channel coefficients $h_{i,j}$ are unknown at the receiver. A soft non-coherent MIMO receiver calculates the LLRs as $$\lambda_i = \log \frac{Pr(a_i = 0 \mid y)}{Pr(a_i = 1 \mid y)}.$$

Space-Time block code (STBC) codes are strong coding/modulation schemes for communication over MIMO channel. A (k,$N_t$,T) STBC, encodes k symbols $x_1, x_2, \ldots, x_K$ chosen from a $2^q$-array constellation to $TN_t$ symbols for transmission from the transmit antenna in T channel uses. STBC codes can be described by a $N_t \times T$ matrix in which column t of an STBC code shows the transmitted signal at the transmit antenna at time t. Two example STBCs are below:

$$C_1 = \begin{bmatrix} x_1 & -x_2^* \\ x_2 & x_1^* \end{bmatrix}$$

$$C_2 = \begin{bmatrix} x_1 & -x_2 & -x_3 & -x_4 & x_1^* & -x_2^* & -x_3^* & -x_4^* \\ x_2 & x_1 & x_4 & -x_3 & x_2^* & x_1^* & x_4^* & -x_3^* \\ x_3 & -x_4 & x_1 & x_2 & x_3^* & -x_4^* & x_1^* & x_2^* \end{bmatrix}.$$

$C_1$ is a (2,2,2) code referred to as Alamouti code that takes two symbols $x_1$ and $x_2$ and transmits $x_1$ from the first antenna and $x_2$ from the second antenna at time t=1. At t=2, first antenna transmits $-x_2^*$ and second one transmits $x_1^*$. Similarly $C_2$ is a (4,3,8) STBC that takes 4 symbols $x_1, x_2, x_3$ and $x_4$ and transmits them in 8 time slots. At time t=1, $x_1, x_2$ and $x_3$ are transmitted from antenna 1, 2 and 3 respectively. At time t=2, $-x_2, x_1$ and $-x_4$ are transmitted from the three antenna and so on.

Similar to Arikan's polar code, a layered polar code could be used with an STBC for reliable communication over a MIMO channel. An STBC-layered polar coding scheme could be constructed in the following way, in an embodiment:

($N_t$, T) STBC, $2^q$-array constellation, (K, M, N) layered polar code

Encoding:

Step 1) Construct a (K, M, N) rate-matched layered polar code

Step 2) Encode the K bit information bits u=[$u_1, u_2, \ldots, u_K$] with the polar code to generate codeword c=[$c_0, c_1, \ldots, c_{M-1}$]

Step 3) zero-padding: If (M mod $qN_t$)≠0, then add $E_0=qN_t-$(M mod $qN_t$) zero-valued bits to the end of c to get c', otherwise no zero-padding is used.

Step 4) Apply an interleaver 1T to get $c'^{(\pi)}=\pi(c')$

Step 5) Transmit $c'^{(\pi)}$ using the STBC for each $qN_t$ bits of $c'^{(\pi)}$. The total number of STBC usage is $$\frac{M + E_0}{qN_t}.$$

Decoding:

Step 1) Employ a soft STBC decoder to decode $$\frac{M + E_0}{qN_t}$$

STBC transmissions and calculate the LLRs of the interleaved codeword $c'^{(\pi)}$, as $\lambda'^{(\pi)}$.

Step 2) De-interleave $X'^{(\pi)}$ to get the LLRs of c' as $\lambda'$

Step 3) Use $\lambda'_0, \lambda'_1, \ldots, \lambda'_{M-1}$ as the input to the decoder of the layered polar code and decode the information vector as $\hat{u} = [\hat{u}_0, \hat{u}_1, \ldots, \hat{u}_{K-1}]$.

Various embodiments are disclosed by way of example herein, including the following example embodiments.

An example embodiment 1 relates to a method comprising: determining a code configuration parameter of a polar code; determining, based on the determined code configuration parameter, encoding graph parameters that identify inputs for one or more kernel operations in each of multiple encoding layers; encoding information symbols by applying the one or more kernel operations to the inputs identified in each encoding layer in accordance with the determined encoding graph parameters.

An example embodiment 2 relates to the method of example embodiment 1, wherein determining a code configuration parameter comprises determining one or more of mother code length N and information block length K.

An example embodiment 3 relates to the method of example embodiment 1 or example embodiment 2, wherein the encoding graph parameters comprise a number of encoding layers m and, for each of the encoding layers, a starting point $s_1$ identifying a position of a first input of an encoding layer i, $1 \le i \le m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied.

An example embodiment 4 relates to the method of example embodiment 1, wherein the code configuration parameter comprises mother code length N, wherein the encoding graph parameters comprise a number of encoding layers m and, for each of the encoding layers, a starting point $s_i$ identifying a position of a first input of an encoding layer i, $1 \le i \le m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of N and $(s_i, d_i)$ are functions of i.

An example embodiment 5 relates to the method of example embodiment 4, wherein determining the encoding graph parameters comprises determining the encoding graph parameters in accordance with:

$m = N - 1$

For $\forall i$, $2^k \le i < 2^{k+1}$ $d_i = 2^k$ $s_i = 2d_i - i - 1$.

An example embodiment 6 relates to the method of example embodiment 1, wherein the code configuration parameter comprises mother code length N, wherein the encoding graph parameters comprise a number of encoding layers m and, for each of the encoding layers, a starting point $s_i$ identifying a position of a first input of an encoding layer i, $1 \le i \le m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of N and $(s_i, d_i)$ are functions of N and i.

An example embodiment 7 relates to the method of example embodiment 6, wherein determining the encoding graph parameters comprises determining the encoding graph parameters in accordance with:

$m = 3N/2 - 2$

For $\forall i$, $$d_i = \begin{cases} 2^{k-1} & \text{if } 2^k - 1 \le i < 2^{k+1} - 1 \text{ and } i \le N - 2 \\ \frac{N}{2} & \text{if } N - 2 < i \le \frac{3N}{2} - 2 \end{cases},$$

$$s_i = \begin{cases} 2^{k+1} - i - 2 & \text{if } 2^k - 1 \le i < 2^{k+1} - 1 \text{ and } i \le N - 2 \\ \frac{3N}{2} - i - 2 & \text{if } N - 2 < i \le \frac{3N}{2} - 2, \end{cases}.$$

An example embodiment 8 relates to the method of example embodiment 1, wherein determining a code configuration parameter comprises determining mother code length N and information block length K, wherein the encoding graph parameters comprise a number of encoding layers m and, for each of the encoding layers, a starting point $s_i$ identifying a position of a first input of an encoding layer i, $1 \le i \le m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of K and N and $(s_i, d_i)$ are functions of K and i.

An example embodiment 9 relates to the method of example embodiment 8, wherein determining the encoding graph parameters comprises determining the encoding graph parameters based in part on an integer $\alpha \le \lfloor \log_2 K \rfloor$ and in accordance with:

$m = 2^{\lfloor \log_2 K \rfloor - \alpha}(N - 1)$

For $\forall i$, $2^{k + \lfloor \log_2 K \rfloor - \alpha} - 2^{\lfloor \log_2 K \rfloor - \alpha} + 1 \le i \le 2^{k+1 + \lfloor \log_2 K \rfloor - \alpha} - 2^{\lfloor \log_2 K \rfloor - \alpha}$ $d_i = 2^k$ $s_i = 2^{k+1} i - 1$.

An example embodiment 10 relates to the method of example embodiment 1, wherein determining a code configuration parameter comprises determining mother code length N and information block length K, wherein the encoding graph parameters comprise a number of encoding layers m and, for each of the encoding layers, a starting point $s_i$ identifying a position of a first input of an encoding layer i, 1≤i≤m, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of K and N and ($s_i$, $d_i$) are functions of K, N and i.

An example embodiment 11 relates to the method of example embodiment 10, wherein determining the encoding graph parameters comprises determining the encoding graph parameters based in part on an integer α≤[$\log_2$ K] and in accordance with:

$$m = 2^{\lfloor \log_2 K \rfloor - \alpha}(3N/2 - 2)$$

For ∀ i, $$d_i = \begin{cases} 2^{k-1} & \text{if } \begin{array}{l} 2^{k+\lfloor \log_2 K \rfloor - \alpha} - 2^{\lfloor \log_2 K \rfloor - \alpha + 1} < i \leq 2^{k+\lfloor \log_2 K \rfloor - \alpha + 1} - \\ 2^{\lfloor \log_2 K \rfloor - \alpha + 1} \text{ and } i \leq 2^{\lfloor \log_2 K \rfloor - \alpha}(N - 2) \end{array} \\ \dfrac{N}{2} & \text{if } 2^{\lfloor \log_2 K \rfloor - \alpha}(N - 2) < i \leq 2^{\lfloor \log_2 K \rfloor - \alpha}(3N/2 - 2) \end{cases}$$

$$s_i = \begin{cases} 2^{k+1} - i - 2 & \text{if } \begin{array}{l} 2^{k+\lfloor \log_2 K \rfloor - \alpha} - 2^{\lfloor \log_2 K \rfloor - \alpha + 1} < i \leq 2^{k+\lfloor \log_2 K \rfloor - \alpha + 1} - \\ 2^{\lfloor \log_2 K \rfloor - \alpha + 1} \text{ and } i \leq 2^{\lfloor \log_2 K \rfloor - \alpha}(N - 2) \end{array} \\ \dfrac{3N}{2} - i - 2 & \text{if } 2^{\lfloor \log_2 K \rfloor - \alpha}(N - 2) < i \leq 2^{\lfloor \log_2 K \rfloor - \alpha}(3N/2 - 2), \end{cases}$$

An example embodiment 12 relates to the method of any one of example embodiments 1 to 11, wherein the one or more kernel operations are associated with a binary or non-binary Arikan kernel.

An example embodiment 13 relates to the method of any one of example embodiments 1 to 12, wherein the one or more kernel operations comprise more than one kernel operation in at least one of the multiple encoding layers.

An example embodiment 14 relates to the method of any one of example embodiments 1 to 12, wherein the one or more kernel operations comprise more than one kernel operation in each of the multiple encoding layers.

An example embodiment 15 relates to a non-transitory computer-readable medium storing instructions which, when executed by one or more processors, cause the one or more processors to perform the method of any one of example embodiments 1 to 14.

An example embodiment 16 relates to an apparatus comprising: a processor; a non-transitory computer-readable medium, coupled to the processor, storing instructions which when executed by the processor cause the one or more processors to perform the method of any one of example embodiments 1 to 14.

An example embodiment 17 relates to an apparatus comprising: an input to receive information symbols; an encoder, coupled to the input, to determine a code configuration parameter of a polar code; to determine, based on the determined code configuration parameter, encoding graph parameters that identify inputs for one or more kernel operations in each of multiple encoding layers; and to encode the information symbols to generate a codeword by applying the one or more kernel operations to the inputs identified in each encoding layer in accordance with the determined encoding graph parameters.

An example embodiment 18 relates to the apparatus of example embodiment 17, wherein the encoder is configured to determine a code configuration parameter by determining one or more of mother code length N and information block length K.

An example embodiment 19 relates to the apparatus of example embodiment 17 or example embodiment 18, wherein the encoding graph parameters comprise a number of encoding layers m and, for each of the encoding layers, a starting point $s_i$ identifying a position of a first input of an encoding layer i, 1≤i≤m, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied.

An example embodiment 20 relates to the apparatus of example embodiment 17, wherein the code configuration parameter comprises mother code length N, wherein the encoding graph parameters comprise a number of encoding layers m and, for each of the encoding layers, a starting point $s_i$ identifying a position of a first input of an encoding layer i, 1≤i≤m, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of N and ($s_i$, $d_i$) are functions of i.

An example embodiment 21 relates to the apparatus of example embodiment 20, wherein the encoder is configured to determine the encoding graph parameters in accordance with:

$m=N-1$

For ∀i, $2^k \leq i < 2^{k+1}$ $d_i = 2^k$ $s_i = 2d_i - i - 1$.

An example embodiment 22 relates to the apparatus of example embodiment 17, wherein the code configuration parameter comprises mother code length N, wherein the encoding graph parameters comprise a number of encoding layers m and, for each of the encoding layers, a starting point $s_i$ identifying a position of a first input of an encoding layer i, 1≤i≤m, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of N and ($s_i$, $d_i$) are functions of N and i.

An example embodiment 23 relates to the apparatus of example embodiment 22, wherein the encoder is configured to determine the encoding graph parameters in accordance with:

$m=3N/2-2$

For ∀ i,
$$d_i = \begin{cases} 2^{k-1} & \text{if } 2^k - 1 \leq i < 2^{k+1} - 1 \text{ and } i \leq N - 2 \\ \dfrac{N}{2} & \text{if } N - 2 < i \leq \dfrac{3N}{2} - 2 \end{cases},$$

$$s_i = \begin{cases} 2^{k+1} - i - 2 & \text{if } 2^k - 1 \leq i < 2^{k+1} - 1 \text{ and } i \leq N - 2 \\ \dfrac{3N}{2} - i - 2 & \text{if } N - 2 < i \leq \dfrac{3N}{2} - 2 \end{cases}.$$

An example embodiment 24 relates to the apparatus of example embodiment 17, wherein the encoder is configured to determine a code configuration parameter by determining mother code length N and information block length K, wherein the encoding graph parameters comprise a number of encoding layers m and, for each of the encoding layers, a starting point $s_i$ identifying a position of a first input of an encoding layer i, $1 \leq i \leq m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of K and N and ($s_i$, $d_i$) are functions of K and i.

An example embodiment 25 relates to the apparatus of example embodiment 24, wherein the encoder is configured to determine the encoding graph parameters based in part on an integer $\alpha \leq \lfloor \log_2 K \rfloor$ and in accordance with:

$$m = 2^{\lfloor \log_2 K \rfloor - \alpha}(N-1)$$

For $\forall i$, $2^{k+\lfloor \log_2 K \rfloor - \alpha} - 2^{\lfloor \log_2 K \rfloor - \alpha + 1} \leq i \leq 2^{k+1+\lfloor \log_2 K \rfloor - \alpha} - 2^{\lfloor \log_2 K \rfloor - \alpha}$ $$d_i = 2^k$$

$$s_i = 2^{k+1} i - 1.$$

An example embodiment 26 relates to the apparatus of example embodiment 17, wherein the encoder is configured to determine a code configuration parameter by determining mother code length N and information block length K, wherein the encoding graph parameters comprise a number of encoding layers m and, for each of the encoding layers, a starting point $s_i$ identifying a position of a first input of an encoding layer i, $1 \leq i \leq m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of K and N and ($s_i$, $d_i$) are functions of K, N and i.

An example embodiment 27 relates to the apparatus of example embodiment 26, wherein the encoder is configured to determine the encoding graph parameters based in part on an integer $\alpha \leq \lfloor \log_2 K \rfloor$ and in accordance with:

$$m = 2^{\lfloor \log_2 K \rfloor - \alpha}(3N/2 - 2)$$

For ∀ i,
$$d_i = \begin{cases} 2^{k-1} & \text{if } \begin{array}{l} 2^{k+\lfloor \log_2 K \rfloor - \alpha} - 2^{\lfloor \log_2 K \rfloor - \alpha + 1} \leq i \leq 2^{k+\lfloor \log_2 K \rfloor - \alpha + 1} - \\ 2^{\lfloor \log_2 K \rfloor - \alpha + 1} \text{ and } i \leq 2^{\lfloor \log_2 K \rfloor - \alpha}(N-2) \end{array} \\ \dfrac{N}{2} & \text{if } 2^{\lfloor \log_2 K \rfloor - \alpha}(N-2) < i \leq 2^{\lfloor \log_2 K \rfloor - \alpha}(3N/2 - 2) \end{cases},$$

$$s_i = \begin{cases} 2^{k+1} - i - 2 & \text{if } \begin{array}{l} 2^{k+\lfloor \log_2 K \rfloor - \alpha} - 2^{\lfloor \log_2 K \rfloor - \alpha + 1} \leq i \leq 2^{k+\lfloor \log_2 K \rfloor - \alpha + 1} - \\ 2^{\lfloor \log_2 K \rfloor - \alpha + 1} \text{ and } i \leq 2^{\lfloor \log_2 K \rfloor - \alpha}(N-2) \end{array} \\ \dfrac{3N}{2} - i - 2 & \text{if } 2^{\lfloor \log_2 K \rfloor - \alpha}(N-2) < i \leq 2^{\lfloor \log_2 K \rfloor - \alpha}(3N/2 - 2) \end{cases}.$$

An example embodiment 28 relates to the apparatus of any one of example embodiments 17 to 27, wherein the one or more kernel operations are associated with a binary or non-binary Arikan kernel.

An example embodiment 29 relates to the apparatus of any one of example embodiments 17 to 28, wherein the one or more kernel operations comprise more than one kernel operation in at least one of the multiple encoding layers.

An example embodiment 30 relates the apparatus of any one of example embodiments 17 to 28, wherein the one or more kernel operations comprise more than one kernel operation in each of the multiple encoding layers.

An example embodiment 31 relates to user equipment comprising the apparatus of any one of example embodiments 16 to 30.

An example embodiment 32 relates to communication network equipment comprising the apparatus of any one of example embodiments 16 to 30.

The invention claimed is:

1. A method comprising: obtaining a code configuration parameter of a polar code; obtaining, based on the code configuration parameter, encoding graph parameters that identify inputs for one or more kernel operations in each of multiple encoding layers; encoding information symbols to generate a codeword by applying the one or more kernel operations to the inputs identified in each encoding layer in accordance with the encoding graph parameters; transmitting by a transmitter the codeword over a channel for reception by a receiver.

2. The method of claim 1, wherein obtaining the code configuration parameter comprises determining one or more of mother code length N and information block length K.

3. The method of claim 1, wherein the encoding graph parameters comprise a number of encoding layers m and, for each of the encoding layers, a starting point $s_i$ identifying a position of a first input of an encoding layer i, $1 \leq i \leq m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied.

4. The method of claim 1,
wherein obtaining the code configuration parameter comprises determining mother code length N and information block length K,
wherein the encoding graph parameters comprise a number of encoding layers m and, for each of the encoding layers, a starting point $s_i$ identifying a position of a first input of an encoding layer i, 1≤i≤m, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of K and N and ($s_i$, $d_i$) are functions of K and i.

5. The method of claim 4, wherein obtaining the encoding graph parameters comprises determining the encoding graph parameters based in part on an integer $\alpha \le \lfloor \log_2 K \rfloor$ and in accordance with:

$$m = 2^{\lfloor \log_2 K \rfloor - \alpha}(N-1)$$

For $\forall i$, $2^{k+\lfloor \log_2 K \rfloor - \alpha} - 2^{\lfloor \log_2 K \rfloor - \alpha} + 1 \le i \le 2^{k+1+\lfloor \log_2 K \rfloor - \alpha} - 2^{\lfloor \log_2 K \rfloor - \alpha}$ $$d_i = 2^k$$

$$s_i = 2^{k+1} i - 1.$$

6. The method of claim 1,
wherein obtaining the code configuration parameter comprises determining mother code length N and information block length K,
wherein the encoding graph parameters comprise a number of encoding layers m and, for each of the encoding layers, a starting point $s_i$ identifying a position of a first input of an encoding layer i, 1≤i≤m, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of K and N and ($s_i$, $d_i$) are functions of K, N and i.

7. The method of claim 6, wherein obtaining the encoding graph parameters comprises determining the encoding graph parameters based in part on an integer $\alpha \le \lfloor \log_2 K \rfloor$ and in accordance with:

$$m = 2^{\lfloor \log_2 K \rfloor - \alpha}(3N/2 - 2)$$

For $\forall i$, $$d_i = \begin{cases} 2^{k-1} & \text{if } \begin{array}{l} 2^{k+\lfloor \log_2 K \rfloor - \alpha} - 2^{\lfloor \log_2 K \rfloor - \alpha + 1} < i \le 2^{k+\lfloor \log_2 K \rfloor - \alpha + 1} - \\ 2^{\lfloor \log_2 K \rfloor - \alpha + 1} \text{ and } i \le 2^{\lfloor \log_2 K \rfloor - \alpha}(N-2) \end{array} \\ \dfrac{N}{2} & \text{if } 2^{\lfloor \log_2 K \rfloor - \alpha}(N-2) < i \le 2^{\lfloor \log_2 K \rfloor - \alpha}(3N/2 - 2) \end{cases},$$

$$s_i = \begin{cases} 2^{k+1} - i - 2 & \text{if } \begin{array}{l} 2^{k+\lfloor \log_2 K \rfloor - \alpha} - 2^{\lfloor \log_2 K \rfloor - \alpha + 1} < i \le 2^{k+\lfloor \log_2 K \rfloor - \alpha + 1} - \\ 2^{\lfloor \log_2 K \rfloor - \alpha + 1} \text{ and } i \le 2^{\lfloor \log_2 K \rfloor - \alpha}(N-2) \end{array} \\ \dfrac{3N}{2} - i - 2 & \text{if } 2^{\lfloor \log_2 K \rfloor - \alpha}(N-2) < i \le 2^{\lfloor \log_2 K \rfloor - \alpha}(3N/2 - 2), \end{cases}.$$

8. The method of claim 1, wherein the one or more kernel operations are associated with a non-binary Arikan kernel.

9. The method of claim 1, wherein the one or more kernel operations comprise more than one kernel operation in at least one of the multiple encoding layers.

10. A non-transitory computer-readable medium storing instructions which, when executed by one or more processors, cause the one or more processors to perform a method comprising: obtaining a code configuration parameter of a polar code; obtaining, based on the code configuration parameter, encoding graph parameters that identify inputs for one or more kernel operations in each of multiple encoding layers; encoding information symbols to generate a codeword by applying the one or more kernel operations to the inputs identified in each encoding layer in accordance with the encoding graph parameters; transmitting by a transmitter the codeword over a channel for reception by a receiver.

11. An apparatus comprising: a processor; a non-transitory computer-readable medium, coupled to the processor, storing instructions which when executed by the processor cause the processor to perform a method comprising: obtaining a code configuration parameter of a polar code; obtaining, based on the code configuration parameter, encoding graph parameters that identify inputs for one or more kernel operations in each of multiple encoding layers; encoding information symbols to generate a codeword by applying the one or more kernel operations to the inputs identified in each encoding layer in accordance with the encoding graph parameters; transmitting by a transmitter the codeword over a channel for reception by a receiver.

12. An apparatus comprising: an input to receive information symbols; an encoder, coupled to the input, to obtain a code configuration parameter of a polar code; to obtain, based on the code configuration parameter, encoding graph parameters that identify inputs for one or more kernel operations in each of multiple encoding layers; and to encode the information symbols to generate a codeword by applying the one or more kernel operations to the inputs identified in each encoding layer in accordance with the encoding graph parameters; a transmitter to transmit the codeword over a channel for reception by a receiver.

13. The apparatus of claim 12, wherein the encoder is configured to obtain the code configuration parameter by determining one or more of mother code length N and information block length K.

14. The apparatus of claim 12, wherein the encoding graph parameters comprise a number of encoding layers m and, for each of the encoding layers, a starting point $s_i$ identifying a position of a first input of an encoding layer i, 1≤i≤m, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied.

15. The apparatus of claim 12,
wherein the encoder is configured to obtain the code configuration parameter by determining mother code length N and information block length K,
wherein the encoding graph parameters comprise a number of encoding layers m and, for each of the encoding layers, a starting point $s_i$ identifying a position of a first input of an encoding layer i, 1≤i≤m, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of K and N and $(s_i, d_i)$ are functions of K and i.

16. The apparatus of claim 15, wherein the encoder is configured to obtain the encoding graph parameters based in part on an integer $\alpha \leq \lfloor \log_2 K \rfloor$ and in accordance with:

$$m = 2^{\lfloor \log_2 K \rfloor - \alpha}(N-1)$$

For $\forall i$, $2^{k+\lfloor \log_2 K \rfloor - \alpha} - 2^{\lfloor \log_2 K \rfloor - \alpha} + 1 \leq i \leq 2^{k+1+\lfloor \log_2 K \rfloor - \alpha} - 2^{\lfloor \log_2 K \rfloor - \alpha}$ $$d_i = 2^k$$

$$s_i = 2^{k+1} i - 1.$$

17. The apparatus of claim 12,
wherein the encoder is configured to obtain the code configuration parameter by determining mother code length N and information block length K,
wherein the encoding graph parameters comprise a number of encoding layers m and, for each of the encoding layers, a starting point $s_i$ identifying a position of a first input of an encoding layer i, $1 \leq i \leq m$, to which a kernel operation of the one or more kernel operations is to be applied, and a separation distance $d_i$ by which a position of each subsequent position of a subsequent input of the encoding layer i to which a kernel operation of the one or more kernel operations is to be applied is separated from a preceding position of a preceding input of the encoding layer i to which a kernel operation of the one or more kernel operations is to be applied, wherein m is a function of K and N and $(s_i, d_i)$ are functions of K, N and i.

18. The apparatus of claim 17, wherein the encoder is configured to obtain the encoding graph parameters based in part on an integer $\alpha \leq \lfloor \log_2 K \rfloor$ and in accordance with:

$$m = 2^{\lfloor \log_2 K \rfloor - \alpha}(3N/2 - 2)$$

For $\forall i$, $$d_i = \begin{cases} 2^{k-1} & \text{if } \begin{array}{l} 2^{k+\lfloor \log_2 K \rfloor - \alpha} - 2^{\lfloor \log_2 K \rfloor - \alpha + 1} < i \leq 2^{k+\lfloor \log_2 K \rfloor - \alpha + 1} - \\ 2^{\lfloor \log_2 K \rfloor - \alpha + 1} \text{ and } i \leq 2^{\lfloor \log_2 K \rfloor - \alpha}(N-2) \end{array} \\ \dfrac{N}{2} & \text{if } 2^{\lfloor \log_2 K \rfloor - \alpha}(N-2) < i \leq 2^{\lfloor \log_2 K \rfloor - \alpha}(3N/2 - 2) \end{cases},$$

$$s_i = \begin{cases} 2^{k+1} - i - 2 & \text{if } \begin{array}{l} 2^{k+\lfloor \log_2 K \rfloor - \alpha} - 2^{\lfloor \log_2 K \rfloor - \alpha + 1} < i \leq 2^{k+\lfloor \log_2 K \rfloor - \alpha + 1} - \\ 2^{\lfloor \log_2 K \rfloor - \alpha + 1} \text{ and } i \leq 2^{\lfloor \log_2 K \rfloor - \alpha}(N-2) \end{array} \\ \dfrac{3N}{2} - i - 2 & \text{if } 2^{\lfloor \log_2 K \rfloor - \alpha}(N-2) < i \leq 2^{\lfloor \log_2 K \rfloor - \alpha}(3N/2 - 2) \end{cases}.$$

19. The apparatus of claim 12, wherein the one or more kernel operations are associated with a non-binary Arikan kernel.

20. The apparatus of claim 12, wherein the one or more kernel operations comprise more than one kernel operation in at least one of the multiple encoding layers.

* * * * *